(12) United States Patent
Herner

(10) Patent No.: US 10,847,677 B2
(45) Date of Patent: Nov. 24, 2020

(54) HIGH BRIGHTNESS LIGHT EMITTING DEVICE WITH SMALL SIZE

(71) Applicant: Black Peak LLC, Boulder, CO (US)

(72) Inventor: Scott Brad Herner, Portland, OR (US)

(73) Assignee: Black Peak, LLC, Boulder, CO (US)

( * ) Notice: Subject to any disclaimer, the term of this patent is extended or adjusted under 35 U.S.C. 154(b) by 0 days.

(21) Appl. No.: 16/729,332

(22) Filed: Dec. 28, 2019

(65) Prior Publication Data

US 2020/0168765 A1 May 28, 2020

Related U.S. Application Data

(63) Continuation of application No. 16/200,654, filed on Nov. 27, 2018, now abandoned.

(51) Int. Cl.
| | |
|---|---|
| *H01L 33/50* | (2010.01) |
| *H01L 25/16* | (2006.01) |
| *H01L 33/62* | (2010.01) |
| *H01L 33/10* | (2010.01) |
| *H01L 33/60* | (2010.01) |
| *H01L 33/00* | (2010.01) |
| *H01L 33/20* | (2010.01) |
| *H01L 29/66* | (2006.01) |

(52) U.S. Cl.
CPC ............ *H01L 33/20* (2013.01); *H01L 25/167* (2013.01); *H01L 33/10* (2013.01); *H01L 33/504* (2013.01); *H01L 33/60* (2013.01); *H01L 33/62* (2013.01); *H01L 29/66765* (2013.01); *H01L 33/0062* (2013.01)

(58) Field of Classification Search
None
See application file for complete search history.

(56) References Cited

U.S. PATENT DOCUMENTS

| | | | | |
|---|---|---|---|---|
| 2008/0309232 | A1* | 12/2008 | Yamamoto | H01L 51/5265 313/505 |
| 2010/0025664 | A1* | 2/2010 | Park | H01L 27/326 257/40 |
| 2017/0047313 | A1* | 2/2017 | Yang | H01L 23/49827 |
| 2017/0250318 | A1* | 8/2017 | Cha | H01L 33/504 |
| 2017/0279084 | A1* | 9/2017 | Sakamoto | H01L 27/3279 |
| 2018/0012949 | A1* | 1/2018 | Takeya | H01L 51/5203 |
| 2018/0182931 | A1* | 6/2018 | Lee | H01L 33/50 |

* cited by examiner

*Primary Examiner* — Michelle Mandala
*Assistant Examiner* — Jordan M Klein
(74) *Attorney, Agent, or Firm* — Scott Brad Herner

(57) ABSTRACT

This application describes a light emitting device or an assembly of light emitting devices. In the completed device, an LED at least partially overlies a thin film transistor and a reflective layer is disposed between the LED and the thin film transistor. Methods to fabricate such devices and assemblies of devices are also described.

13 Claims, 19 Drawing Sheets direction of light to viewer

HIGH BRIGHTNESS LIGHT EMITTING DEVICE WITH SMALL SIZE

RELATED APPLICATIONS

This is a continuation application of U.S. patent application Ser. No. 16/200,654 filed Nov. 27, 2018, and is related to U.S. patent application Ser. No. 15/984,370 filed May 20, 2018, which are assigned to the assignee hereof and filed by the inventor hereof and which is incorporated by reference herein.

FIELD

The embodiments of the invention are directed generally to light emitting devices with high brightness and small area.

BACKGROUND

Light emitting devices can form displays when integrated in arrays. Light emitting devices often comprise a light emitting diode (LED) and a transistor. There is a large interest in fabricating displays comprising many individual LEDs with small area, sometimes called micro LEDs, with minimal spacing between the LEDs, resulting in a large density of LEDs. The current manufacturing steps to fabricate light emitting devices with small LEDs and transistors in high density are not cost effective. It is advantageous to reduce the cost of assembling small LEDs into light emitting devices. In addition, it is advantageous to increase the brightness of small light emitting devices.

SUMMARY

Embodiments described herein provide for a light emitting device with small size, high brightness, and lower cost manufacturing steps than conventional methods. In one embodiment, a light emitting device comprises a thin film transistor, an LED, wherein the LED at least partially overlies the transistor, and a reflective layer disposed between the thin film transistor and the LED. The LED has a surface area, which is the area in a plane parallel to the LED substrate, which can be small, for example less than 40,000 square microns.

Another embodiment is an assembly of light emitting devices comprising a plurality of thin film transistors, a plurality of LEDs wherein each LED of the plurality at least partially overlies a thin film transistor of the plurality of thin film transistors, a reflective layer, wherein the reflective layer is or are disposed between an LED of the plurality of LEDs and a thin film transistor of the plurality of thin film transistors; and a backboard with a plurality of interconnects. The LEDs can have a small area, for example less than 40,000 square microns per LED.

Another embodiment is a method to fabricate a light emitting device comprising the steps of forming a structure, the structure formed by steps comprising: a) forming an LED on an LED substrate; b) forming a reflective layer overlying the LED; c) forming a thin film transistor overlying the LED, wherein a first interconnect extends through the reflective layer electrically connecting the LED to the thin film transistor; d) forming a dielectric layer overlying the thin film transistor; e) forming a second interconnect and a third interconnect extending through the dielectric layer, wherein the second and third interconnects are electrically connected to the thin film transistor; and flipping the structure comprising the LED, the reflective layer, the thin film transistor, the first, second, and third interconnects, and the dielectric layer, so that, in the completed device, the LED at least partially overlies the thin film transistor, and the reflective layer is disposed between the thin film transistor and the LED.

Another embodiment is a method to fabricate an assembly of light emitting devices comprising the steps of: forming a structure, the structure formed by steps comprising: a) forming a plurality of LEDs on an LED substrate; b) forming a reflective layer; c) forming a plurality of thin film transistors, wherein each thin film transistor of the plurality of thin film transistors at least partially overlies an LED of the plurality of LEDs; d) forming a first plurality of interconnects, wherein each interconnect of the plurality extends through the reflective layer; e) forming a dielectric layer overlying the thin film transistors; f) forming a second plurality of interconnects extending from the thin film transistors through the dielectric layer; flipping the structure comprising the plurality of LEDs, the reflective layer, the plurality of thin film transistors, the first and second plurality of interconnects, and the dielectric layer, so that, in the completed device, each LED of the plurality of LEDs at least partially overlies a thin film transistor of the plurality of thin film transistors; and bonding the second plurality of interconnects to a backboard.

BRIEF DESCRIPTION OF THE DRAWINGS

The drawings are not to scale, and the thickness and dimensions of some layers may be exaggerated for clarity. These and other features, aspects, and advantages of the embodiments described herein will become better understood with regard to the following description, appended claims, and accompanying drawings, where:

DETAILED DESCRIPTION OF THE DISCLOSURE

Figure 1:
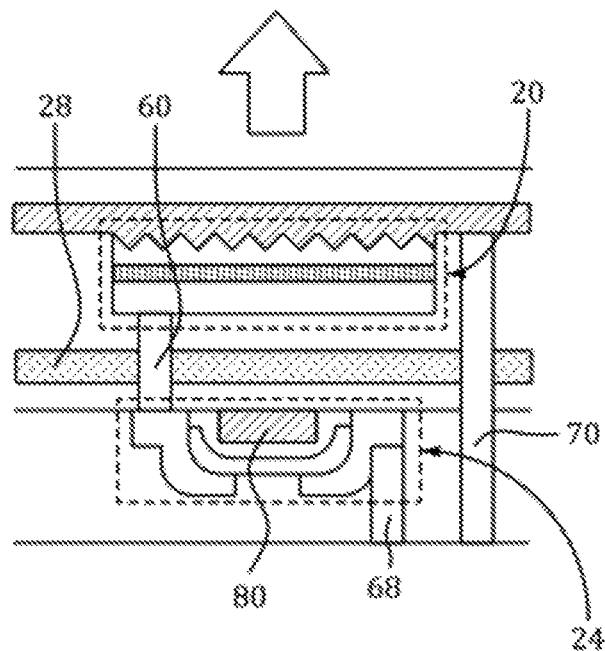
FIG. 1 illustrates a cross sectional view of one embodiment of a single light emitting device wherein the thin film transistor has been formed by a "gate first" method and a transparent conductive layer is connected to one of the conductive layers of the LED.

Some embodiments of a light emitting device described herein comprise an LED, a reflective layer, and a thin film transistor. The thin film transistor modulates the current supplied to the LED. Other embodiments will comprise elements to connect light emitting devices to a backboard. In the embodiments described herein, singulation of LEDs is avoided. Singulation describes the separation of one LED die from a group fabricated on an LED substrate, such as a semiconductor wafer. Conventional methods of singulation include sawing the LED substrate, which results in kerf loss where the sawing blade traveled through the LED substrate. The kerf can be as much as 100 microns wide. Kerf loss increases the cost of LEDs due to inefficient use of LED substrate space. Kerf loss during light emitting device separation is minimized in the embodiments described herein. In conventional methods of light emitting device fabrication, the singulated LED is then electrically connected to a transistor using, for example, mechanical placement of the LED and wire bonding. Mechanical placement of single LEDs and wire bonding are costly manufacturing steps. In embodiments of the present invention, many devices are fabricated concurrently on a substrate, reducing costs compared to fabrication of single a light emitting device. Instead of singulation of one light emitting device, groups of light emitting devices are diced, which reduces total kerf loss, and allows smaller light emitting devices with smaller pitch to be manufactured. The pitch is the distance from the edge of one light emitting device to the same edge of an adjacent light emitting device. The size and pitch of the light emitting devices are reduced compared to conventional devices. The completed light emitting device(s) described herein can be used as part of a display. However, it should be recognized that embodiments described herein can have a broad range of applications.

An embodiment of a single light emitting device will first be described. A detailed description of an embodiment to fabricate a single light emitting device will follow. Other embodiments of single light emitting devices will be then described. An embodiment of an assembly of light emitting devices will be described. A detailed description of an embodiment to fabricate an assembly of light emitting devices will follow. Other embodiments of assemblies of light emitting devices will be then described. In the figures shown, the LED and thin film transistor are of similar size for clarity, but in general, the LED will be much larger than the thin film transistor. The area of the LED describes the area of the LED that is substantially planar to the plane of the substrate on which it is fabricated. For example, the LED may have an area of 40,000 square microns while the thin film transistor may have an area of 50 square microns.

When reference is made herein to a method comprising two or more defined steps, the defined steps can be carried out in any order or simultaneously (except where context or specific instruction excludes that possibility), and the method can include one or more other steps carried out before any of the defined steps, between two of the defined steps, or after all the defined steps (except where context excludes that possibility).

Single Light Emitting Device

One embodiment is shown in cross section in FIG. 1. It is to be understood that although one light emitting device is shown, the one device may be one among many. The light emitting device comprises an LED 20, a thin film transistor 24, and a reflective layer 28 disposed between LED 20 and thin film transistor 24. The LED 20 may have a small surface area, such as less than 40,000 square microns, or less than 1,000 square microns, or less than 100 square microns. Thin film transistor 24 modulates the electrical current to LED 20, which controls the amount of light produced by the light emitting device. Reflective layer 28 reflects light emitted by LED 20 in the direction indicated by the arrow, directing more light towards the viewer. A first interconnect 60 extends through reflective layer 28 and electrically connects LED 20 to thin film transistor 24. Second interconnect 68 electrically connects thin film transistor 24 to other devices (not shown). A third interconnect (not shown) electrically connects to the gate 80 of thin film transistor 24 in a plane above or below the plane of the page, and is therefore not visible in FIG. 1. The third interconnect will be shown later in FIG. 2G. Fourth interconnect 70 electrically connects LED 20 to other devices or to ground (not shown). In this embodiment, LED 20 completely overlies thin film transistor 24. In other embodiments, the LED may partially overlie the thin film transistor. With thin film transistor 24 completely underneath LED 20, other LEDs can be placed adjacent to LED 20 with minimal spacing between them. To summarize, a light emitting device is described comprising a thin film transistor 24, an LED 20 having a surface area at least partially overlying the thin film transistor 24, a reflective layer 28 disposed between the LED 20 and thin film transistor 24, and an interconnect 60 extending through the reflective layer 28 electrically connecting the LED 20 to the thin film transistor 24.

By fabricating reflective layer 28 underneath LED 20, the amount of light directed towards the viewer is increased. By fabricating thin film transistor 24 underneath the LED instead of alongside it, adjacent light emitting devices can be placed closely together, increasing the density of LEDs per area.

Figure 2A:
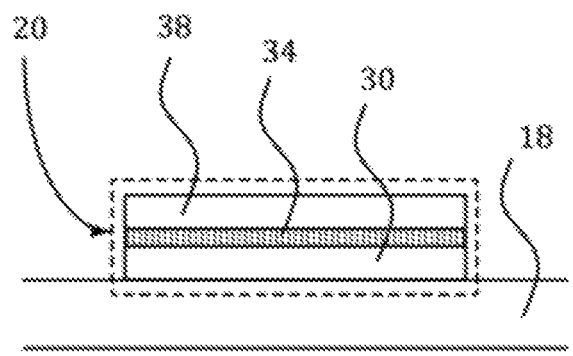
FIGS. 2A-2J illustrate cross sectional or isometric views of steps of one embodiment in the fabrication of a light emitting device.

One embodiment of a fabrication sequence to make the embodiment shown in FIG. 1 will now be described. By using whole-wafer process fabrication and avoiding singulation of LEDs, the LEDs in the present invention can be smaller and more closely packed together. Use of expensive conventional single device fabrication techniques such as wire bonding can be minimized. As shown in cross section in FIG. 2A, LED 20 is fabricated on LED substrate 18. LED 20 comprises first conductive layer 30 which is disposed on LED substrate 18, an active layer 34 disposed on first conductive layer 30, and a second conductive layer 38 disposed on active layer 34. It is to be understood that this one LED may represent one of many LEDs on LED substrate 18.

LED substrate 18 upon which LED 20 is fabricated can be any suitable single crystal semiconductor, including but not limited to sapphire, SiC, GaN, ZnO, and Si. LED substrate 18 should be made of single crystal material which is substantially crystal lattice matched with the first conductive layer 30. Substantially crystal lattice matched is to mean the mismatch between the two crystal lattices is less than about 25%. For example, GaN and sapphire are substantially crystal lattice matched, with a lattice mismatch of 16%.

First conductive layer 30 and second conductive layer 38 may be any suitable semiconductor layer known to those skilled in the art, including but not limited to GaP, AlGaAs, GaAsP, AlGaP, GaInP, InGaN, SiC, AlGaN, AlN, InN, or InP, most preferably GaN. First conductive layer 30 and second conductive layer 38 may the same or different materials. For example, the first and second conductive layers 30 and 38 may be GaN doped to opposite polarity, for example, n-type and p-type. Active layer 34 may be fabricated of any standard semiconductor materials, for example InGaN, in any formation, for example single quantum well, multiple quantum wells, or double heterostructure. As known to those skilled in the art, in other embodiments, there may be so-called current blocking layers (not shown) above and below active layer 34 (i.e. active layer 34 may be deposited on a current blocking layer, and a current blocking layer may be deposited on active layer 34). The principles and mechanisms of the conductive and active layers are well known to those skilled in the art, and are thus omitted herein. Any suitable method may be used to deposit LED semiconducting materials, including but not limited to metal organic chemical vapor deposition (MOCVD), hydride vapor phase epitaxy, or molecular beam epitaxy, most preferably MOCVD.

Figure 2B:
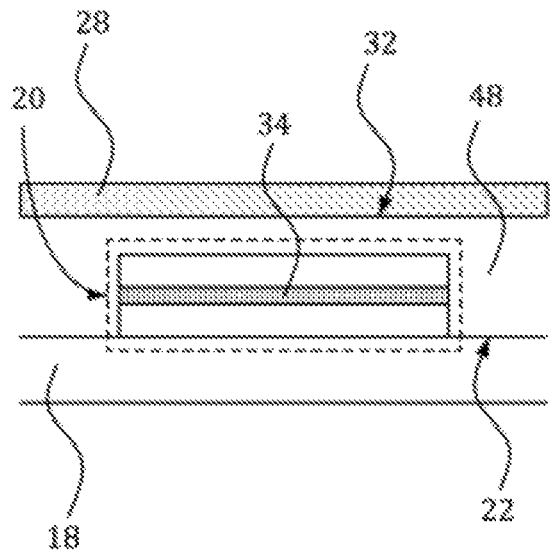

Referring to FIG. 2B, a first dielectric layer 48 is deposited on LED 20 and LED substrate 18. First dielectric layer 48 may be any suitable material, including but not limited to $SiO_2$, $Al_2O_3$, $TiO_2$, SiN, or combinations thereof, most preferably $SiO_2$. First dielectric layer 48 is substantially transparent to light of the wavelength emitted by active layer 34. Substantially transparent is to mean at least 70% of the light is transmitted through the layer. First dielectric layer 48 can be deposited by any suitable means, such as evaporation, sputtering, chemical vapor deposition (CVD), or spin-on techniques, most preferably by CVD. After deposition, first dielectric layer 48 may be planarized. Planarization is the process by which the top surface 32 of first dielectric layer 48 is rendered substantially parallel to surface 22 of LED substrate 18. Planarization may be accomplished by any suitable technique, including but not limited to chemical mechanical planarization (CMP), wet chemical etch, or plasma etch in corrosive gas, most preferably by CMP. Subsequent steps in fabrication will be described assuming that dielectric layer 48 of FIG. 2 has been planarized. It is to be understood that the fabrication could proceed without this planarizing step. The thickness of first dielectric layer 48, which is to mean the distance between surface 22 and surface 32, can be between 0.05 and 100 microns, most preferably about 2 microns.

A reflective layer 28 is deposited on surface 32 of first dielectric layer 48. Reflective layer 28 may be any suitable material that substantially reflects visible light of the wavelength emitted by active layer 34. Substantially reflective is to mean at least 70% of the light is reflected by the layer. Suitable materials include but are not limited to metals like aluminum, gold, or silver, alloys of aluminum, gold, or silver, a composite material such as a polymer mixed with metal oxide particles, or a distributed Bragg reflector (DBR), most preferably a DBR. A DBR includes one or more pairs of dielectric layers (not shown). Each dielectric layer in a pair has a different index of refraction. The dielectric layers of the DBR may be deposited by any suitable method, including but not limited to evaporation, sputtering, CVD, or atomic layer deposition (ALD), which is a type of CVD, most preferably by evaporation. The thickness of each dielectric layer in the DBR is designed to be about one quarter of the wavelength of light that is to be reflected. The wavelength of light varies with the index of refraction of each material. For example, for an active layer of an LED that emits blue light with a wavelength from 440 to 460 nm, a suitably reflective DBR would be comprised of one to ten, most preferably five, pairs of aluminum oxide (index of refraction is 1.5 to 1.7) and titanium oxide (index of refraction is 2.3 to 2.7) layers, where the aluminum oxide layer is 67±7 nm thick and the titanium oxide layer is 49±5 nm thick. A reflective layer 28 that is a DBR may comprise silicon oxide, silicon nitride, aluminum oxide, tantalum oxide, or titanium oxide, or any other suitable dielectric materials. While reflective layer 28 is shown as a continuous layer in FIG. 2B, it is to be understood that reflective layer 28 may not be continuous in all embodiments, and there may be multiple reflective layers in other embodiments.

Figure 2C:
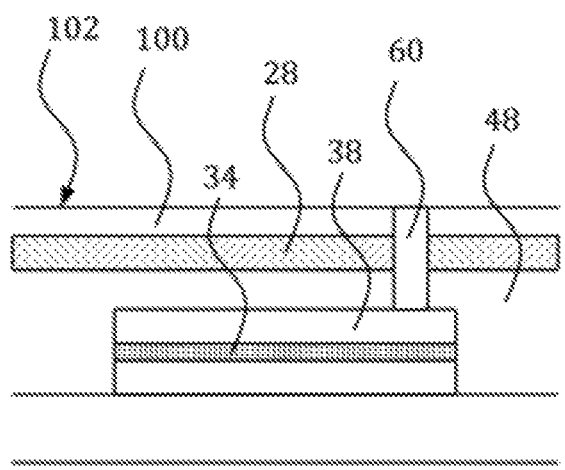

Referring to FIG. 2C, a second dielectric layer 100 is deposited on reflective layer 28. Second dielectric layer 100 may be any suitable material, including but not limited to $SiO_2$, $Al_2O_3$, $TiO_2$, SiN, or combinations thereof, most preferably $SiO_2$. Second dielectric layer 100 is substantially transparent to light of the wavelength emitted by the active layer 34. Second dielectric layer 100 can be deposited by any suitable means, such as evaporation, sputtering, CVD, or spin-on techniques, most preferably by CVD. The thickness of second dielectric layer 100 may be between 0.05 and 10 microns, most preferably about 0.2 microns.

A first interconnect 60 extending through reflective layer 28 is next fabricated. A masking layer such as photoresist (not shown) is applied and patterned, and portions of layers 100, 28, and 48 are removed by etching. At least a portion of conductive layer 38 is exposed after this etch is complete. The etching may be accomplished by any suitable etchant, such as corrosive gases like $CHF_3$, $SF_6$, HBr, or wet chemical acid, such as hydrofluoric acid (HF), nitric acid ($HNO_3$), or sulfuric acid ($H_2SO_4$), most preferably by corrosive gas. The masking layer is then removed. First interconnect 60 is then deposited into the cavity where layers 100, 28, and 48 were removed, as shown in FIG. 2C. In one embodiment, first interconnect 60 is cylinder-shaped in plan view cross section, with the diameter of the cylinder in contact with conductive layer 38, although any suitable shape may be used. In one example, the diameter of the cylinder-shaped portion of first interconnect 60 is 0.8 microns, although any suitable dimension may be used. First interconnect 60 may be made of any suitable material that is conductive, and is preferably substantially transparent to light of the wavelength emitted by the active layer 34, for example light with dominant wavelength 300 to 730 nm. For substantial transparency, first interconnect 60 may comprise ITO, FTO, AZO, metallic nanoparticles, carbon nanotubes, graphene, or conductive polymers such as Poly(3,4-ethylenedioxythiophene, or PEDOT). Examples of first interconnect 60 materials that are not transparent may include but are not limited to titanium, titanium nitride, tungsten, tantalum, tantalum nitride, and aluminum. First interconnect 60 forms a substantially ohmic contact to conductive layer 38. In some embodiments, conductive layer 38 may have had an ohmic contact layer (not shown) formed on it prior to fabrication of interconnect 60. In this case, the ohmic contact would occur between first interconnect 60 and the ohmic contact layer (not shown). First interconnect 60 may be deposited by any suitable technique, including but not limited to evaporation, CVD, sputtering, solution deposition, or spray pyrolysis, most preferably CVD. Interconnect material that is deposited on surface 102 of second dielectric layer 100 may be removed by any suitable technique, including but not limited to CMP, wet chemical etch, plasma etch in corrosive gas, most preferably CMP.

Figure 2D:
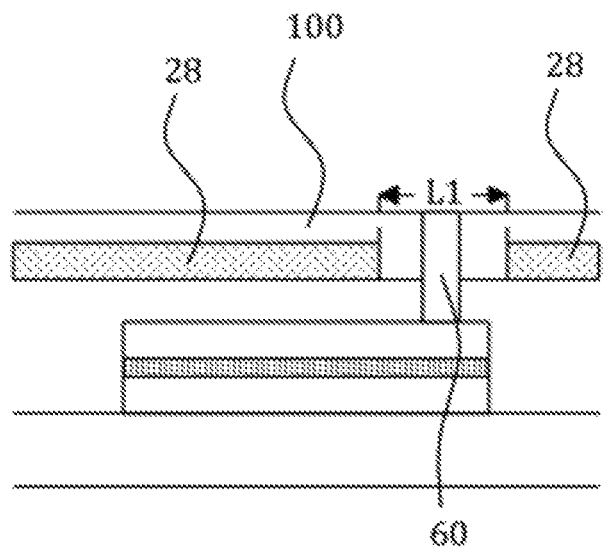

Referring to FIG. 2D, in a different embodiment, reflective layer 28 may have been patterned (not shown) and etched prior to deposition of second dielectric layer 100, forming portions of reflective layer 28. Even when reflective layer 28 is etched into multiple disconnected pieces, it will be referred to as reflective layer 28 since it was deposited as a single layer. In this embodiment, the pattern and etch created opening L1 in reflective layer 28, through which first interconnect 60 extends. Some portion of second dielectric layer 100 is disposed between the two portions of reflective layer 28 and first interconnect 60. The fabrication of openings in reflective layer 28 is needed when reflective layer 28 is conductive. By etching openings larger than the diameter of first interconnect 60 and insuring some dielectric material is disposed between a conductive reflective layer 28 and first interconnect 60, electrical connection between reflective layer 28 and first interconnect 60 is avoided. This technique is not needed when reflective layer 28 comprises a dielectric material, such as a DBR.

Figure 2E:
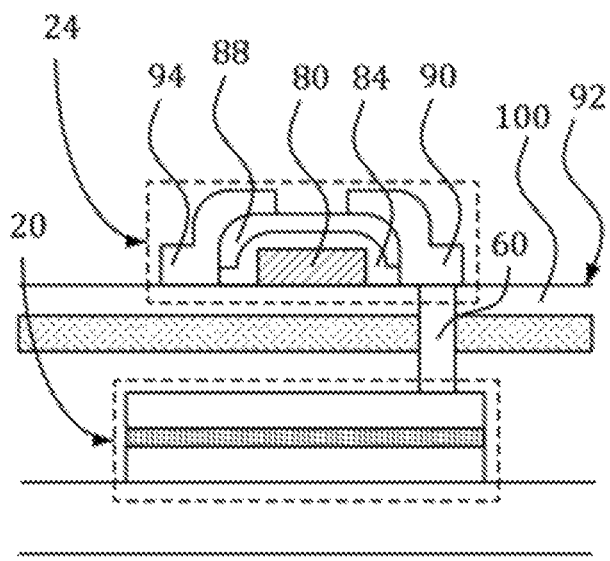

Referring to FIG. 2E, thin film transistor 24 is next fabricated. In the embodiment shown in FIG. 2E, thin film transistor 24 is fabricated by a "gate first" process. Any suitable thin film transistor process, including but not limited to "gate last" or vertical channel thin film transistor process, may be used. In a "gate first" process, the gate 80 is first fabricated. A gate layer is deposited using any suitable conductive material, including but not limited to doped silicon, doped silicon germanium, doped germanium, or a metal such as molybdenum, aluminum, titanium, titanium nitride, tantalum, tantalum nitride, chrome, tungsten, or tungsten nitride. A masking layer such as photoresist (not shown) is applied and patterned, and portions of the gate layer are removed by etching, leaving gate 80. The etching may be accomplished by any suitable etchant, such as corrosive gases like $CHF_3$, $SF_6$, HBr, or wet chemical acid, such as HF, $HNO_3$, or $H_2SO_4$, most preferably by corrosive gas. The masking layer is then removed.

Next the gate dielectric 84 and channel 88 are fabricated. A gate dielectric layer may be deposited by any suitable method, including but not limited to spin on, sputtering, evaporation, or CVD techniques. As the gate dielectric 84 and channel 88 are necessarily etched from a larger initial gate dielectric layer and channel layer, the reference numbers for each shall refer to the final etched layers. The gate dielectric layer may be any suitable material, including but not limited to silicon oxide, silicon nitride, aluminum oxide, hafnium oxide, hafnium silicon oxide, or combinations thereof. The gate dielectric layer is deposited on the gate 80. The channel layer is then deposited on the gate dielectric layer. The channel layer may be deposited by any suitable method, including but not limited to sputtering, evaporation, or CVD techniques. The channel layer may be any suitable material, including but not limited to silicon, silicon-germanium, germanium, zinc oxide, indium zinc oxide (IZO), indium gallium zinc oxide (IGZO), zinc oxide nitride (ZnON), or combinations thereof. The channel layer material may be amorphous, polycrystalline, or single crystal. A masking layer such as photoresist (not shown) is applied and patterned, and portions of the channel layer and gate dielectric layer are removed by etching. The etching may be accomplished by any suitable etchant, such as corrosive gases like $CHF_3$, $SF_6$, HBr, or wet chemical acid, such as HF, $HNO_3$, or $H_2SO_4$, most preferably by corrosive gas. The masking layer is then removed. Gate 80 and gate dielectric 84, as shown in FIG. 2E, are fabricated by this step.

Next, the source 94 and the drain 90 are fabricated. A source and drain layer may be fabricated of any suitable material, including but not limited to molybdenum, doped silicon, doped germanium, or doped silicon germanium. The source and drain layer is first deposited on channel 88, surface 92 of dielectric layer 100, and interconnect 60. The source and drain layer may be deposited by any suitable technique, including but not limited to sputtering, evaporation, or CVD techniques. A masking layer such as photoresist (not shown) is applied and patterned, and portions of the source and drain layer are removed by etching. The etching may be accomplished by any suitable etchant, such as corrosive gases like $CHF_3$, $SF_6$, HBr, or wet chemical acid, such as HF, $HNO_3$, or $H_2SO_4$, most preferably by corrosive gas. The masking layer is then removed, leaving source 94 and drain 90. Drain 90 is in electrical contact with first interconnect 60, which, in turn, is in electrical contact with LED 20. Thin film transistor 24 fabrication is now substantially complete.

Figure 2F:
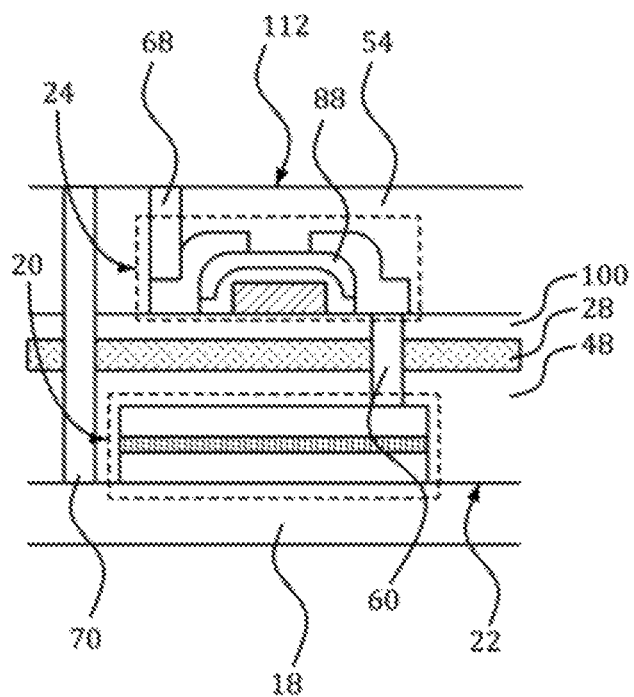

Referring to FIG. 2F, a third dielectric layer 54 is deposited over thin film transistor 24. Third dielectric layer 54 may be planarized by any suitable technique, such as CMP or etch-back, most preferably CMP, leaving surface 112 of dielectric layer 54 substantially parallel to surface 22 of LED substrate 18. Subsequent steps in fabrication will be described assuming that third dielectric layer 54 of FIG. 2 has been planarized. It is to be understood that the fabrication could proceed without this planarizing step. Next, a masking layer such as photoresist (not shown) is applied and patterned, and portions of third dielectric layer 54 are removed by etching in specific locations. The etching may be accomplished by any suitable etchant, such as corrosive gas like $CHF_3$ or wet chemical acid, such as HF, most preferably by corrosive gas. The masking layer is then removed. The cavities in third dielectric layer 54 formed by this etching step are then filled with conductive material to form the second interconnect 68, a third interconnect (not visible), and a fourth interconnect 70. The third interconnect is not visible as it exists in a plane above or below the plane of the page in FIG. 2F, and will be shown in the following FIG. 2G. Second, third, and fourth interconnects are preferably substantially transparent to light of the wavelength emitted by LED 20, for example light with dominant wavelength 300 to 730 nm. Substantially transparent materials for second, third, and fourth interconnects include but are not limited to ITO, AZO, FTO, a conductive polymer such as PEDOT, metallic nanoparticles, carbon nanotubes, graphene, or conductive polymers. Materials for second, third, and fourth interconnects that are not transparent but are still suitable include but are not limited to titanium, titanium nitride, tungsten, tantalum, tantalum nitride, aluminum, or combinations thereof. Second interconnect 68 is electrically connected to thin film transistor 24. Fourth interconnect 70 extends through dielectric layers 54, 100, and 48, and reflective layer 28, making contact to LED substrate 18. Second, third, and fourth interconnects may be deposited by any suitable technique, including but not limited to evaporation, CVD, sputtering, evaporation, solution deposition, or spray pyrolysis, most preferably CVD. Interconnect material that is deposited on surface 112 of third dielectric layer 54 may be removed by any suitable technique, including but not limited to CMP, wet chemical etch, and plasma etch in corrosive gas, most preferably by CMP. If LED substrate 18 is viewed as the bottom, and third dielectric layer 54 as the top shown in the orientation in FIG. 2F, LED 20 underlies thin film transistor 24. In other embodiments, LED 20 may partially underlie thin film transistor 24. In this embodiment, the LED, the thin film transistor, the reflective layer, the interconnects, and dielectric layers are referred to as the structure at this point in fabrication.

Figure 2G:
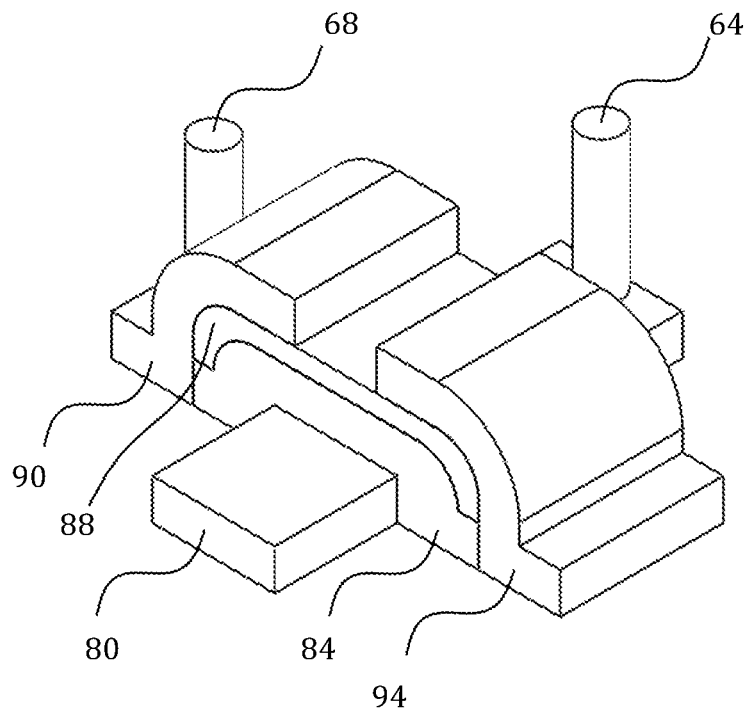

Referring to FIG. 2G, an isometric view of the thin film transistor-only is shown. Dielectric layer 24 is not shown in this figure for clarity. Third interconnect 64, which is was not visible in FIG. 2F, is now visible and in electrical contact with gate 80. Interconnect 68 is in electrical contact with source 90, although the point of contact is not visible in FIG. 2F. Interconnects 64 and 68 are shown with a square cross section, but may have a circular or other shape cross section. Other elements of the thin film transistor, gate dielectric 84, channel 88, and drain 94, are shown for clarity.

Figure 2H:
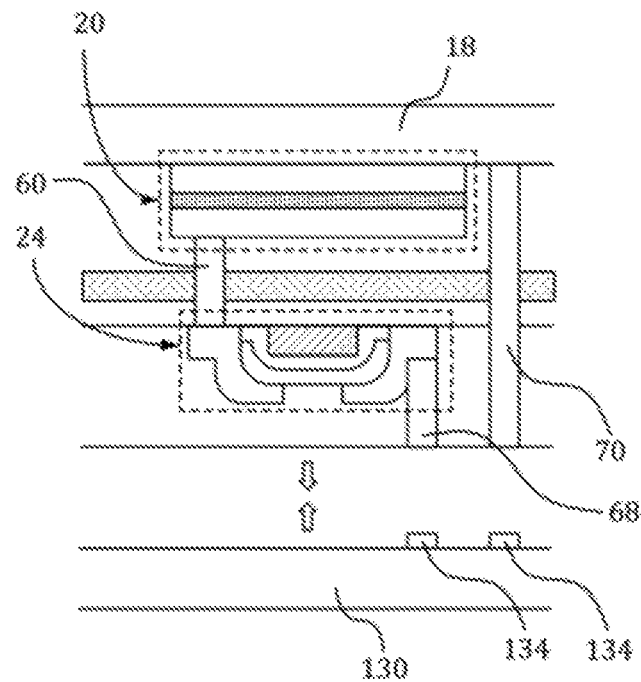
Figure 2I:
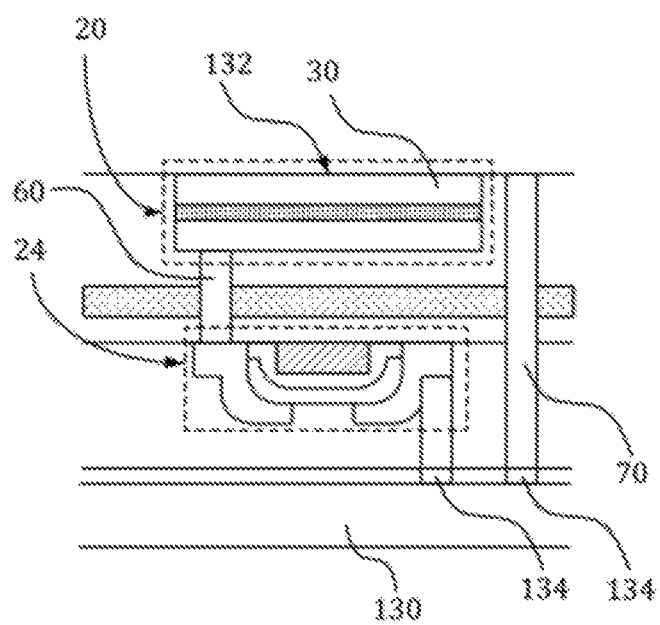

Referring to FIG. 2H, the structure comprising LED substrate 18 with LED 20 and thin film transistor 24 is now flipped and bonded to a backboard 130. Backboard 130 comprises metal wires 134, which extend perpendicular to the page in FIG. 2H. In one embodiment, this technique is sometimes referred to as flip-chip bonding, as the devices on each respective substrate face one another. In the orientation shown in FIG. 2G, LED 20 now overlies thin film transistor 24. After bonding, interconnects 64, 68, and 70 are connected electrically to metal wires 134, as shown in FIG. 2I. Interconnect 64 is not visible in FIG. 2I. Any suitable bonding technique may be used, including but not limited to thermocompression, anodic, plasma activated, eutectic, or surface activated, most preferably anodic bonding. In one embodiment, backboard 130 may be a printed circuit board (PCB) comprising FR-4 substrate and copper interconnects. In a different embodiment, backboard 130 may be an interposer comprising a silicon or glass substrate with metal wires 134 comprising copper or aluminum. An interposer can generally provide smaller feature sizes and pitches of metal interconnects compared with a PCB, and an interposer is preferred for this reason. The interposer may comprise such aspects as metal wires 134 and/or adhesive metal layers (not shown) defined by conventional masking and lithography, etch and mask removal, micro bump connections, ball or stud bumps, copper paste, through silicon vias (TSVs), or any suitable feature needed to connect to the transistors to other devices to form a display. To summarize, a method to fabricate a light emitting device is describing comprising the steps of forming a structure, the structure formed by the steps comprising forming an LED 20 on an LED substrate 18, forming a reflective layer 28 overlying LED 20, forming a thin film transistor 24 overlying LED 20 wherein a first interconnect 60 extends through reflective layer 28 electrically connecting LED 20 to thin film transistor 24, forming a dielectric layer 54 overlying the thin film transistor 24, forming second interconnect 64 and third interconnect 68 extending through dielectric layer 54 wherein the second interconnect 64 and third interconnect 68 electrically connect to thin film transistor 24; and flipping the structure comprising LED 20, reflective layer 28, thin film transistor 24, first interconnect 60, second interconnect 64, third interconnect 68, and dielectric layer 54, so that LED 20 at least partially overlies thin film transistor 24 in the completed device, and the reflective layer 28 is disposed between the thin film transistor 24 and the LED 20.

In another embodiment, adhesive metal (not shown) may be used to join the second, third, and fourth interconnects 64, 68, and 70 to metal wires 134. Adhesive metal may be deposited on either interconnects 64, 68, and 70, or on metal wires 134, and then patterned, and etched, to form layers on top of either interconnects 64, 68, and 70, or metal wires 134. Interconnects 64, 68, and 70 are electrically connected to metal wires 134 at the point of mutual contact with the adhesive metal. The principles and mechanisms of wafer bonding are well known to those skilled in the art, and are thus omitted herein.

After bonding, some portion or all of LED substrate 18 may be removed. In other embodiments, LED substrate 18 may not be removed if LED substrate 18 is substantially transparent to light emitted by the active layer of the LED. LED substrate 18 may be removed by a laser process. If LED substrate 18 is sapphire, a KrF Excimer laser with an energy density of 400 $mJ/cm^2$, a wavelength of 248 nm, and a pulse width of 38 ns can irradiate the sapphire surface at an elevated temperature of 60° C. and remove the sapphire substrate from first conductive layer 30. If LED substrate 18 is GaAs, a solution of $NH_4OH:35H_2O$ or a solution of $5H_3PO_4:3H_2O_2:3H_2O$ can be applied to remove the GaAs substrate from first conductive layer 30. If LED substrate 18 is silicon, a solution of KOH, TMAH, $HF+HNO_3$, or $HF+NH_4F$ can be applied to remove LED substrate 18.

Referring to FIG. 2I, LED 20 and thin film transistor 24 are bonded to backboard 130 at least at the point of contact to metal wires 134. After LED substrate removal, first conductive layer 30 has a surface 132. Surface 132 may be roughened to enhance light extraction from the LED. For example, if first conductive layer 30 is GaN or AlGaInN, surface 132 can be roughened by etching in a solution of KOH. If first conductive layer 30 is GaP, AlGaP, or AlGaN-InP, a solution of HCl and $H_3PO_4$ can roughen surface 132. If first conductive layer 30 is GaP, a corrosive gas mixture of $BCl_3$, $Cl_2$, and Ar can roughen surface 132. In other embodiments, first conductive layer 30 is not roughened.

Figure 2J:
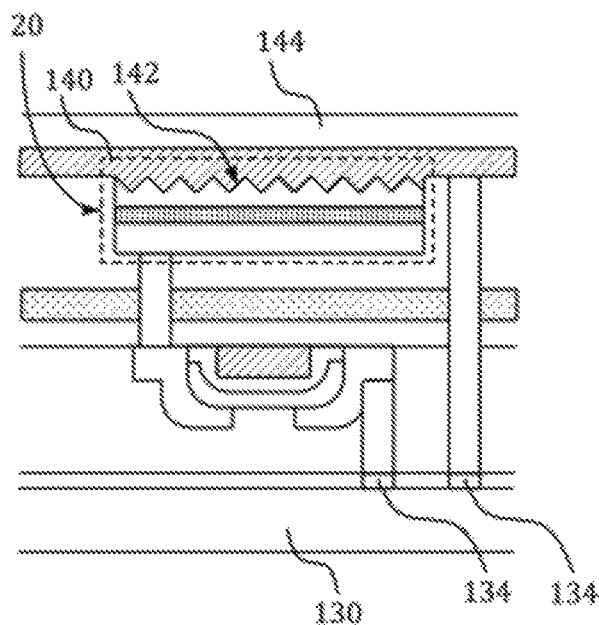

Referring to FIG. 2J, the roughened surface of conductive layer 30 is now referred to as surface 142. Transparent conductive layer 140 is deposited on surface 142 of conductive layer 30. Transparent conductive layer 140 makes a substantially ohmic contact to first conductive layer 30. Transparent conductive layer 140 may any suitable material, including but not limited to indium tin oxide (ITO), aluminum zinc oxide (AZO), fluorine-doped tin oxide (FTO), metallic nanoparticles, carbon nanotubes, graphene, conductive polymers, or very thin layers of aluminum, silver, nickel, or a stack of a nickel layer followed by a gold layer. Transparent conductive layer 140 may be deposited by any suitable technique, such as evaporation, CVD, or sputtering, most preferably evaporation.

A fourth dielectric layer 144 is deposited on transparent conductive layer 140. Fourth dielectric layer 144 may be any suitable material, including but not limited to $SiO_2$, $Al_2O_3$, $TiO_2$, SiN, or combinations thereof, most preferably $SiO_2$. Fourth dielectric layer 144 is substantially transparent to light of the wavelength emitted by LED 20. Fourth dielectric layer 144 can be deposited by any suitable means, such as evaporation, sputtering, CVD, or spin-on techniques, most preferably by CVD. The thickness of fourth dielectric layer 144 may be between 0.05 and 10 microns, most preferably about 0.2 microns. The description above is a detailed description of one embodiment of a single light emitting device and method of manufacture. Several other embodiments are described below.

Figure 3:
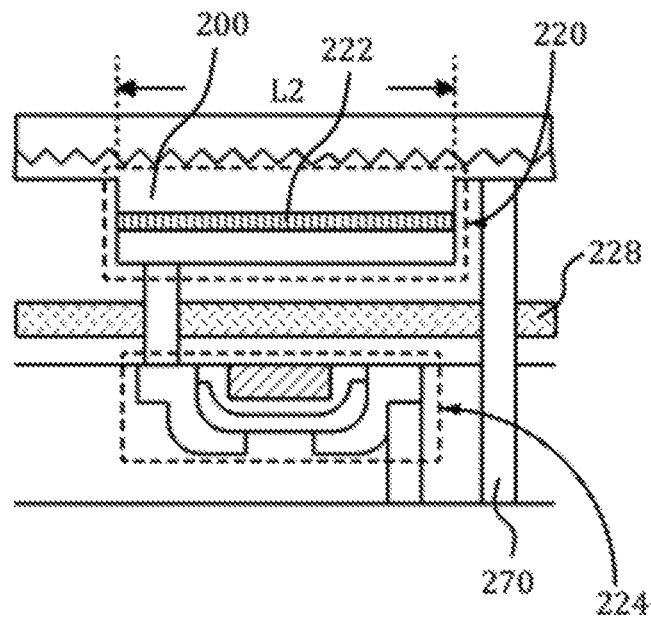
FIG. 3 illustrates a cross sectional view of one embodiment of a light emitting device wherein the thin film transistor has been formed by a "gate first" method.

A different embodiment of a light emitting device is shown in cross sectional schematic in FIG. 3. In this embodiment, during fabrication of the LED 220, first conductive layer 200 is only partially etched. The light emitting portion LED 220 is defined by the dimension L2 of active layer 222 while first conductive layer 200 extends beyond dimension L2. In this embodiment, LED 220 is in immediate electrical contact with first interconnect 270 by first conductive layer 200, instead of through an intervening conductive layer, as in the previous embodiment. Thin film transistor 224 is fabricated by a "gate first" process.

Figure 4:
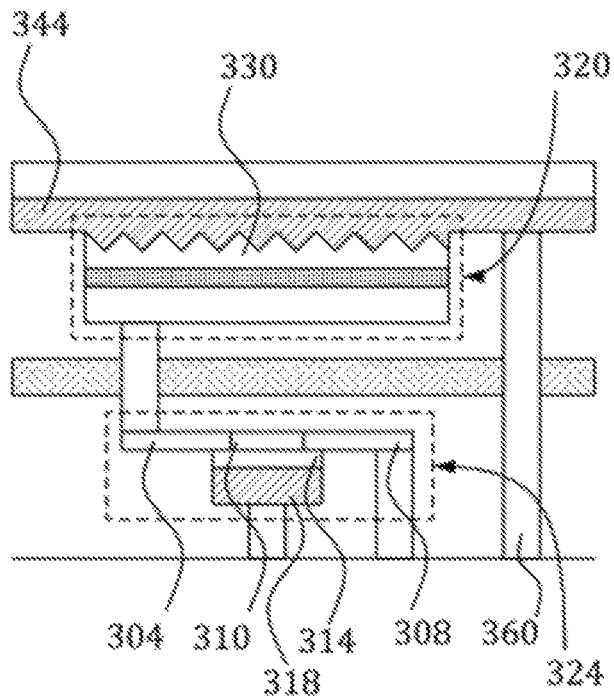
FIG. 4 illustrates a cross sectional view of one embodiment of a light emitting device wherein the thin film transistor has been made by a "gate last" method, and a transparent conductive layer is connected to one of the conductive layers of the LED.

A different embodiment of a light emitting device is shown in cross sectional schematic in FIG. 4. Thin film transistor 324 is fabricated by a "gate last" process. In the "gate last" process, the source 308, drain 304, and channel 310 are fabricated first, followed by the gate dielectric 314, and finally the gate 318. In this embodiment, transparent conductive layer 344 electrically connects conductive layer 330 of LED 320 to interconnect 360.

Figure 5:
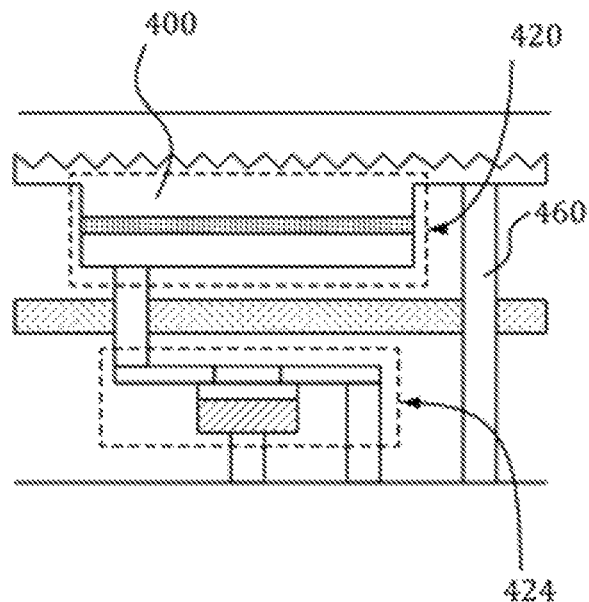
FIG. 5 illustrates a cross sectional view of one embodiment of a light emitting device wherein the LED has been made by a "gate last" method.

A different embodiment of a light emitting device is shown in cross sectional schematic in FIG. 5. During fabrication of the LED 420, first conductive layer 400 is only partially etched. In this embodiment, LED 420 is in immediate electrical contact to interconnect 460 by first conductive layer 400, instead of through an intervening conductive layer, as in the previous embodiment. In this embodiment, thin film transistor 424 is fabricated by a "gate last" process.

Figure 6A:
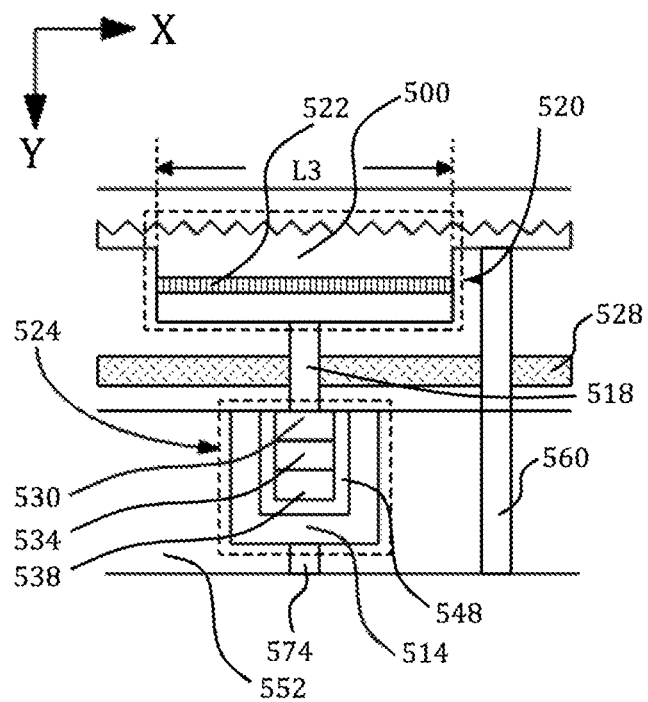
FIG. 6A illustrates a cross sectional view of one embodiment of a light emitting device wherein the thin film transistor has a vertical channel.

Another embodiment of a light emitting device is shown in cross section in FIG. 6A. Thin film transistor 524 is a vertical channel thin film transistor. Thin film transistor 523 is surrounded by dielectric layer 532. In vertical channel thin film transistors charge carriers travel between source and drain in a direction that is substantially perpendicular to the plane of the substrate on which the thin film transistor is fabricated. Referring to FIG. 6A, charge carriers travel from source 538 to drain 530 through channel layer 534 in the Y direction. The gate layer 514 is in contact with the gate dielectric layer 548. Thin film transistor 524 is electrically connected to LED 520 by first interconnect 518. LED 520 is electrically connected to interconnect 560 through first conductive layer 500. Interconnects 560 and 518 extend through reflective layer 528. Another interconnect electrically connects to source 538 in a plane either above or below the plane of the page, and the connection is therefore not visible in FIG. 6A.

Figure 6B:
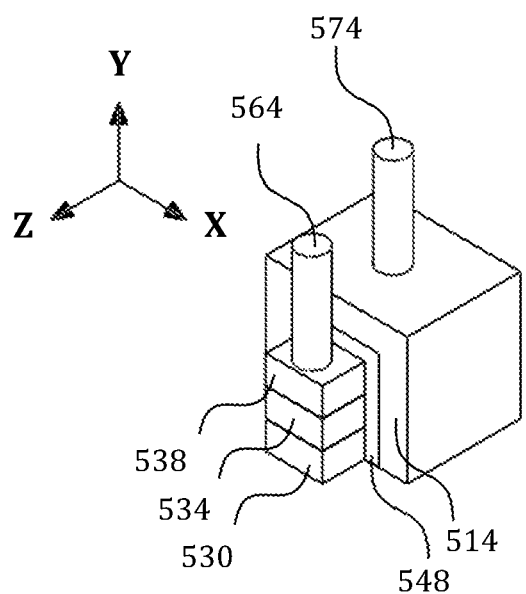
FIG. 6B illustrates an isometric view of the thin film transistor-only of FIG. 6A with a vertical channel before light emitting device fabrication is complete. The thin film transistor shown in FIG. 6A has been "flipped over" when compared to the view of the thin film transistor in FIG. 6B.

Referring to FIG. 6B, an isometric view of only the vertical thin film transistor 524 is shown. Dielectric layer 552 is not shown in FIG. 6B for clarity. Vertical thin film transistor 524 is shown before the structure is flipped and bonded, and so the device in FIG. 6B is shown inverted for clarity, compared to FIG. 6A. Drain 530, channel 534, and source 538 are arranged in a vertical stack, and are partially enclosed by gate dielectric 548. Gate 514 overlies gate dielectric 548. Interconnect 564, which was not visible in FIG. 6A, is in electrical contact with source 538, and interconnect 574 is in electrical contact with gate 514.

Figure 7:
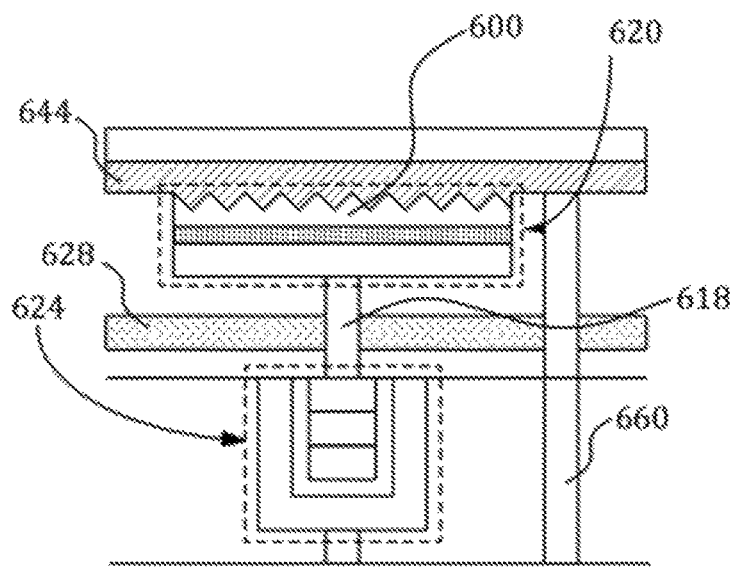
FIG. 7 illustrates a cross sectional view of one embodiment of a light emitting device wherein the LED at least partially overlies a thin film transistor that has a vertical channel, and a transparent conductive layer is connected to one of the conductive layers of the LED.

Another embodiment of a light emitting device is shown in FIG. 7. Thin film transistor 624 is a vertical channel thin film transistor. Thin film transistor 624 is electrically connected to LED 620 by interconnect 618. LED 620 is electrically connected to interconnect 660 through transparent conductive layer 644. Interconnects 660 and 618 extend through reflective layer 628.

It is to be understood that the aforementioned embodiments imply no limitation upon the light emitting device. Any suitable thin film transistor may be combined with an LED, with a reflective layer disposed between the LED and the thin film transistor.

Assembly of Light Emitting Devices

Figure 8:
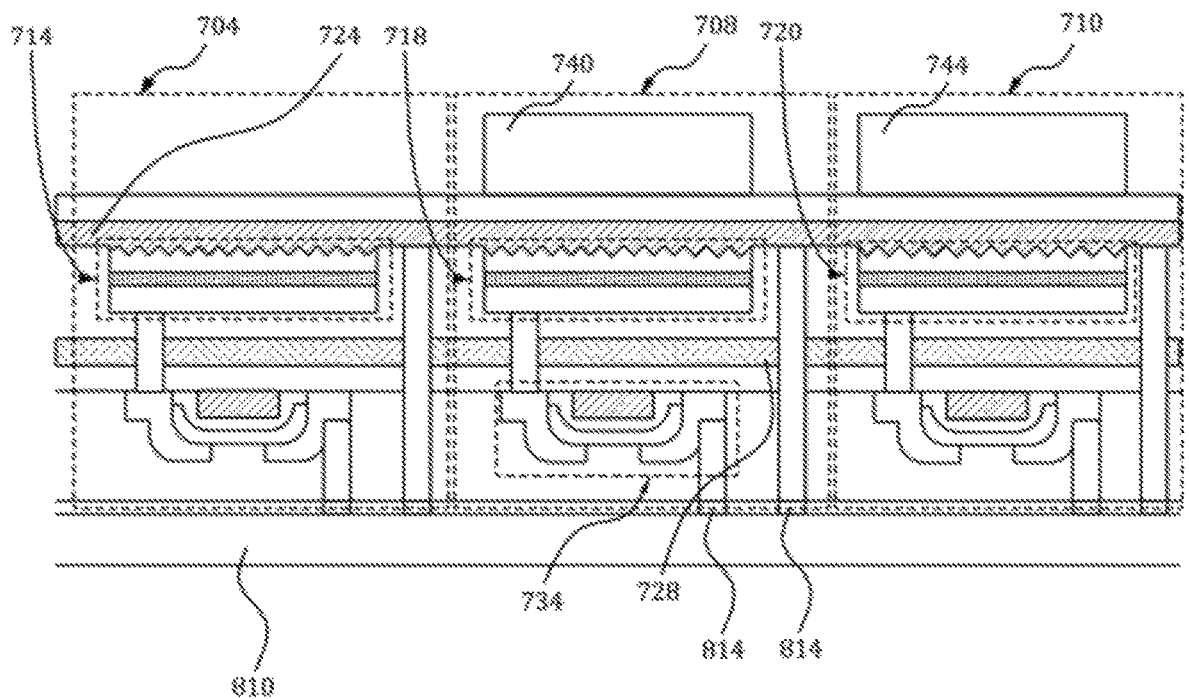
FIG. 8 illustrates a cross sectional view of one embodiment of an assembly of light emitting devices wherein each LED at least partially overlies a thin film transistor that has been formed by a "gate first" method, a transparent conductive layer is connected to one of each of the conductive layers of the LEDs, and wavelength-converting layers overlie at least some of the light emitting devices.

A description of one embodiment of an assembly of light emitting devices and its method of manufacture is now described. An assembly refers to a plurality of light emitting devices. The light emitting devices in an assembly may be grouped. The assembly may comprise one or more groups. Referring to FIG. 8, an embodiment of a group of three light emitting devices 704, 708, and 710 is shown, although it is to be understood there may be many more light emitting devices than shown in the group. Each light emitting device, shown by representative light emitting device 708, comprises an LED 718, a thin film transistor 734, and a reflective layer 728. Each LED at least partially overlies the thin film transistor to which it is electrically connected. In this embodiment, the LEDs are fabricated of the same materials and emit light of the same dominant wavelength. A transparent conductive layer 724 electrically connects the LEDs in the group, and a plurality of wavelength-converting layers 740 and 744 overlie LEDs 718 and 720, respectively, while LED 714 does not have a wavelength-converting layer overlying it. Each of the wavelength-converting layers 740 and 744 is excited by light emitted by the LED underlying it, and emits light of a different dominant wavelength than the LED. In other embodiments, there may be no wavelength converting layers in the assembly. The devices are bonded to backboard 810 and the thin film transistor of each light emitting device is electrically connected to metal wires 814 after bonding. A group of three light emitting devices may form a color pixel in a display, as each light emitting device may emit light of a different dominant wavelength. To summarize, one embodiment of an assembly of light emitting devices comprises a plurality of thin film transistors, a plurality of LEDs wherein each LED of the plurality has a surface area, each LED of the plurality at least partially overlies the thin film transistor to which it is electrically connected, a reflective layer disposed between the plurality of LEDs and thin film transistors, and a backboard with a plurality of metal wires.

Figure 9A:
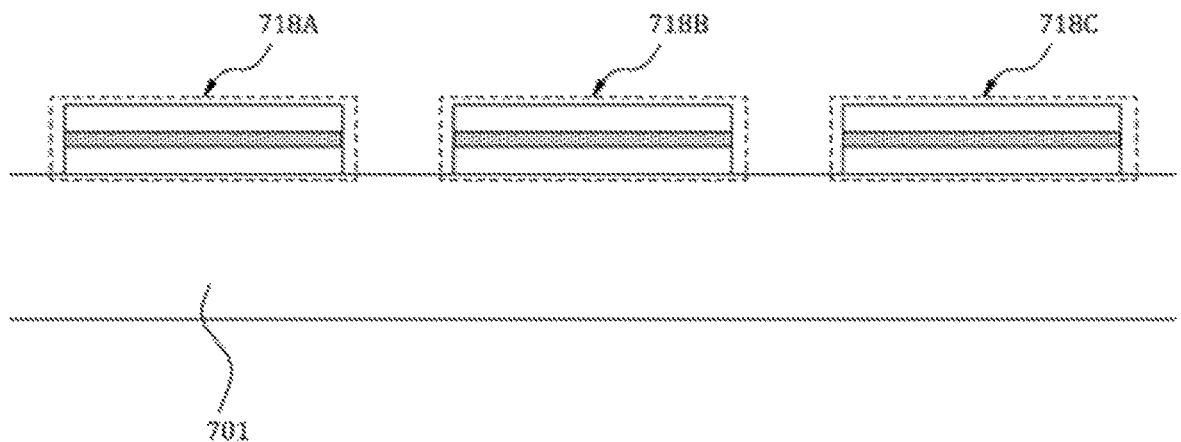
FIGS. 9A-9J illustrate cross sectional views of steps in one embodiment in the fabrication of an assembly of light emitting devices.

Referring to FIG. 9A, one embodiment of a fabrication method for an assembly of light emitting devices will now be described. Many of the steps in fabrication of an assembly are the same as the previous description for a single device, and those steps will be summarized. Where the steps are different or new, a more detailed description will be provided. As shown in FIG. 9A, LEDs 718 are fabricated on LED substrate 701. It is to be understood that these three LEDs can be among many more LEDs fabricated on LED substrate 701.

Figure 9B:
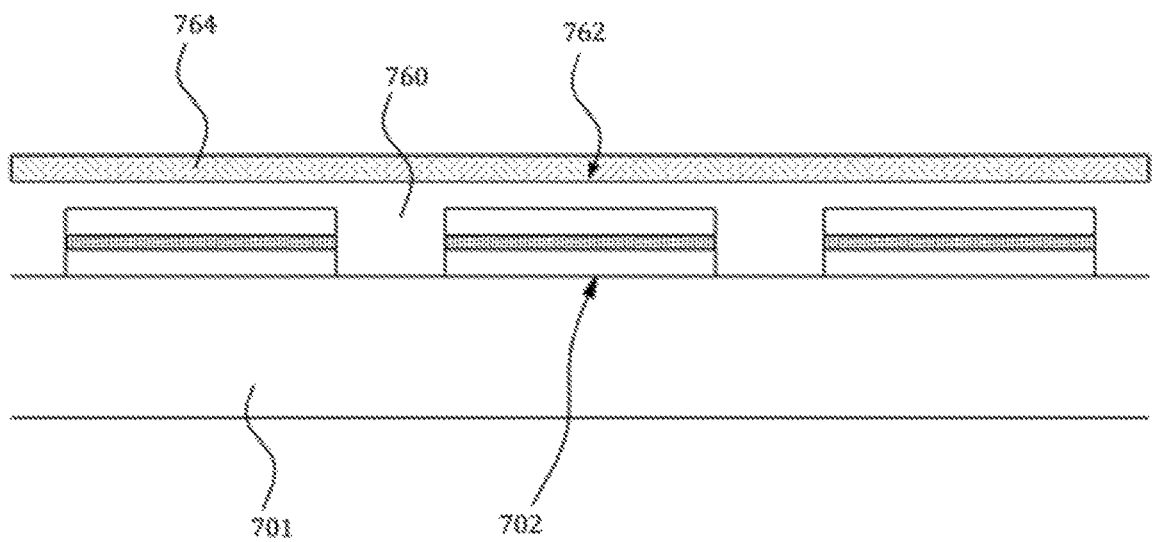

Referring to FIG. 9B, a first dielectric layer 760 is deposited on the LEDs and LED substrate 701. After deposition, first dielectric layer 760 may be planarized rendering its' top surface 762 substantially parallel to surface 702 of LED substrate 701. A reflective layer 764 is deposited on first dielectric layer 760. While reflective layer 764 is shown as a continuous layer in FIG. 9B, it is to be understood that the reflective layer 764 may not be continuous in the completed assembly in all embodiments, and there may be multiple portions of the reflective layer in other embodiments.

Figure 9C:
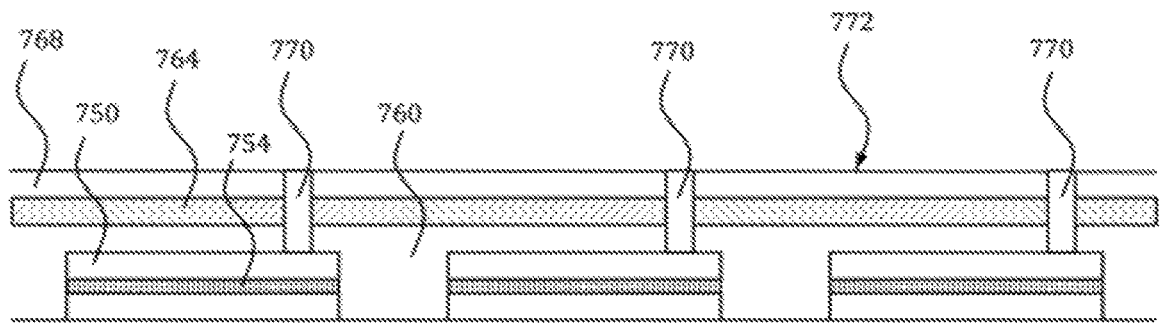

Referring to FIG. 9C, a second dielectric layer 768 is deposited on reflective layer 764. A first plurality of interconnects 770 extending through reflective layer 768 are next fabricated. First plurality of interconnects 770 may be made of any suitable material that is conductive, and is preferably substantially transparent to light of the wavelength emitted by the active layer 754 of the LEDs, for example light with a dominant wavelength of 300 to 730 nm. First plurality of interconnects 770 form substantially ohmic contacts to conductive layers 750. In some embodiments, conductive layers 750 may have had an ohmic contact layer (not shown) formed on them prior to fabrication of interconnects 770. In this case, the ohmic contact layer would be between interconnect 770 and the unshown ohmic contact layer, and would facilitate electrical connection between interconnect 770 and conductive layer 750. Interconnect material that is deposited on surface 772 of second dielectric layer 768 may be removed by any suitable technique.

Figure 9D:
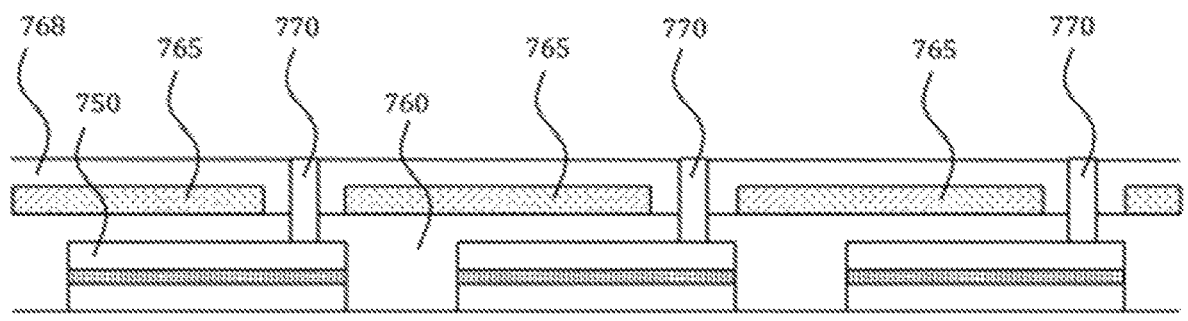

Referring to FIG. 9D, an alternative embodiment of reflective layer 765 is shown in schematic cross section. In this embodiment, after deposition, reflective layer 765 is patterned (not shown) and etched to remove portions. Second dielectric layer 768 is then deposited on reflective layer 765 and in the cavities where reflective layer 765 was removed. First plurality of interconnects 770 are formed in dielectric layers 768 and 760, making electrical contact to conductive layer 750. In this embodiment, first plurality of interconnects 770 are insulated from reflective layer 765 by second dielectric layer 768.

Figure 9E:
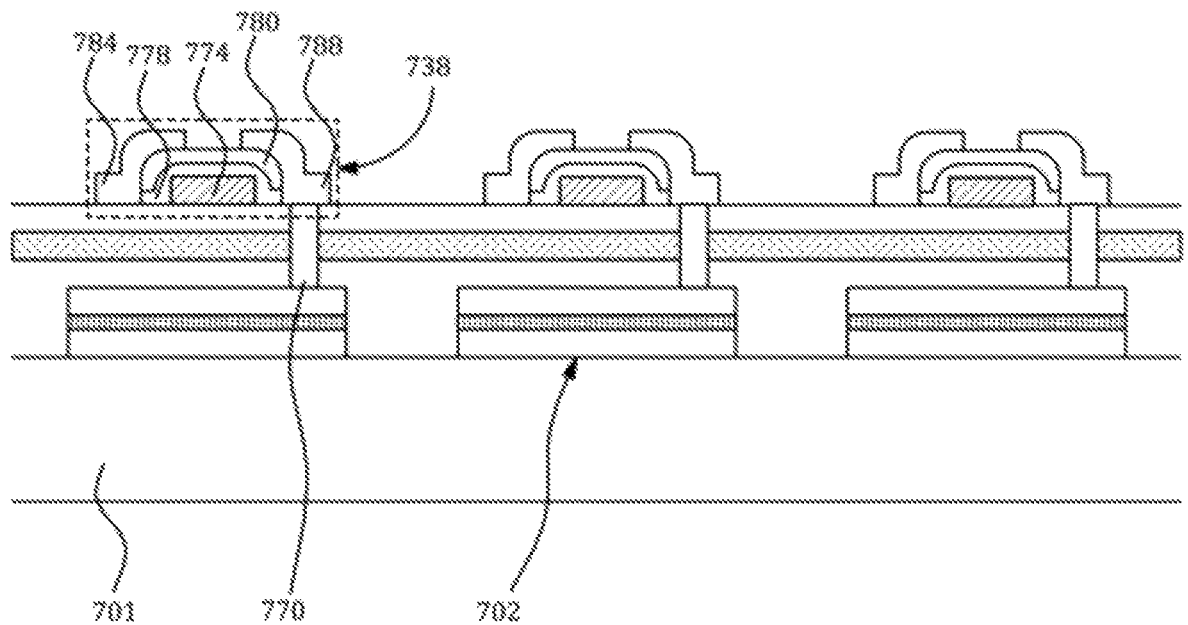

Referring to FIG. 9E, thin film transistors are next fabricated. In this embodiment, the thin film transistors are fabricated by a "gate first" process. However, any suitable thin film transistor process, including but not limited to "gate last" or vertical channel thin film transistor processes, may be used. Representative thin film transistor 738 comprises the gate 774, the gate dielectric 778, the channel 780, the source 784, and the drain 788.

Figure 9F:
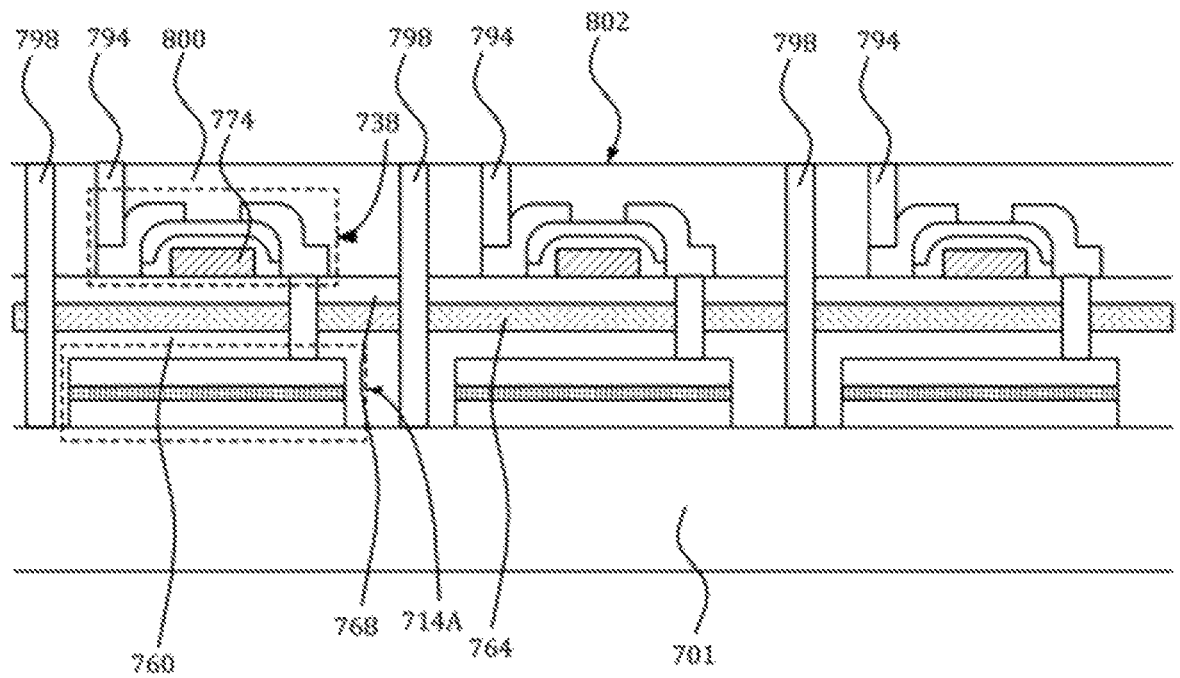

Referring to FIG. 9F, a third dielectric layer 800 is then deposited over the thin film transistors. The second plurality of interconnects 794, including some interconnects that are not visible in FIG. 9F, and the third plurality of interconnects 798 are then formed. The second and third plurality of interconnects are preferably substantially transparent to light of the wavelength emitted by the active layer of the LEDs, for example light with dominant wavelength 300 to 730 nm. Each interconnect in the second plurality of interconnects 794 electrically connects to a thin film transistor 738. The interconnects in the third plurality of interconnects 798 contact LED substrate 701 at this point in fabrication. An interconnect electrically connects to gate 774 in a plane above or below the plane of the page, and the connection is therefore not visible in FIG. 9F. This unseen interconnect is shown in the single device in FIG. 2G. In this embodiment, the plurality of LEDs, the reflective layer, the plurality of thin film transistors, the interconnects, and the dielectric layer are referred to as a structure at this point in fabrication.

Figure 9G:
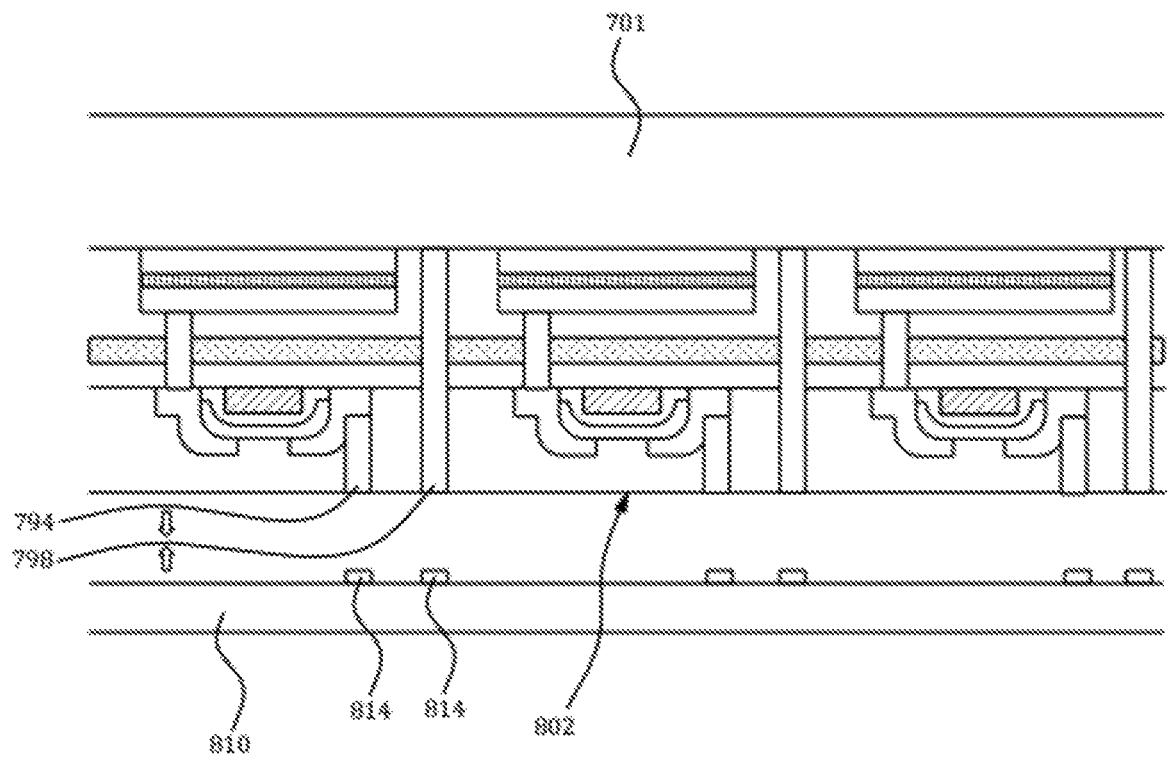
Figure 9H:
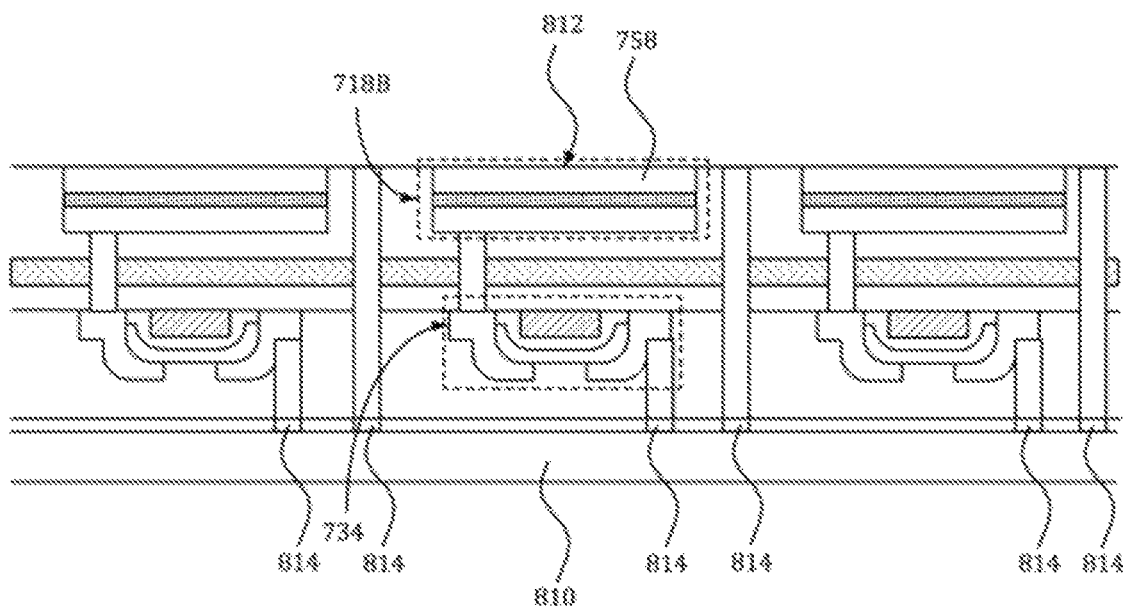

Referring to FIG. 9G, the structure is now flipped over in preparation for bonding to the backboard 810. Backboard 810 comprises metal wires 814. The metal wires are shown in cross section in FIG. 9G, and extend perpendicular to the page. Referring to FIG. 9H, backboard 810 is bonded to the thin film transistors and LEDs at metal wires 814. After bonding, interconnects 794 and 798 are connected electrically to metal wires 814.

In another embodiment, adhesive metal (not shown) may be used to join the interconnects 794 and 798 to metal wires 814. Adhesive metal may be deposited on either interconnects 794 and 798, or metal wires 814, patterned and etched, to form layers on top of either interconnects 794 and 798, or metal wires 814. Interconnects 794 and 798 are then electrically connected to metal wires 814 at the point of mutual contact with the adhesive metal.

After bonding, some thickness or all of LED substrate 701 may be removed. In other embodiments, LED substrate 701 may not be removed if the LED substrate is substantially transparent to light emitted by the active layer of the LEDs. In subsequent figures, LED substrate 701 is completely removed.

After LED substrate removal, first conductive layer 758 has a surface 812 as shown in FIG. 9H. Surface 812 may be roughened to enhance light extraction from the LED. In other embodiments, first conductive layer 758 is not roughened. In the orientation shown in FIG. 9H, representative LED 718 now overlies representative thin film transistor 734 after bonding.

Figure 9I:
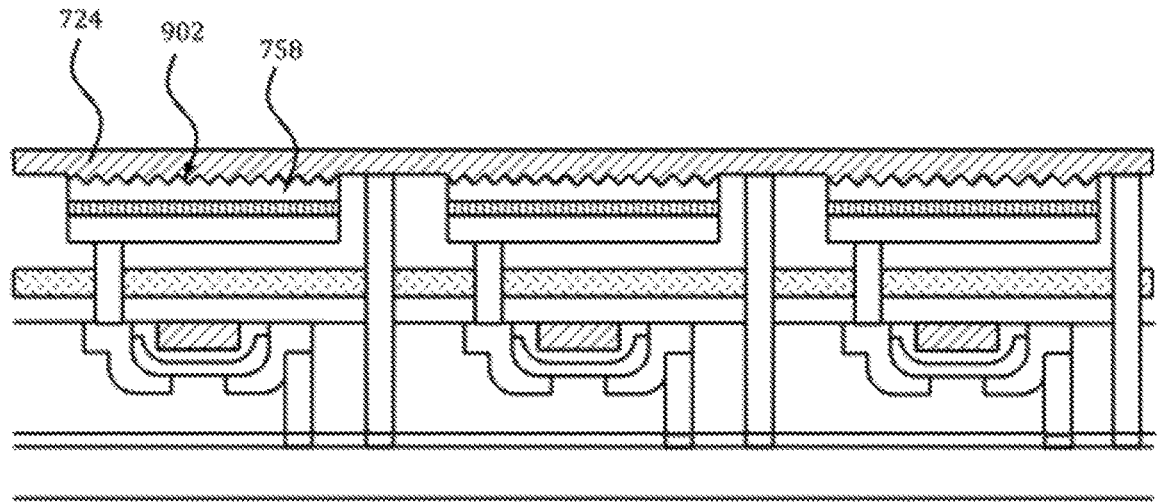

Referring to FIG. 9I, after roughening, the surface layer of conductive layer 758 is referred to as surface layer 902. Next, transparent conductive layer 724 is deposited on surface 902 of conductive layer 758. Transparent conductive layer 724 makes a substantially ohmic contact to first conductive layer 758.

Figure 9J:
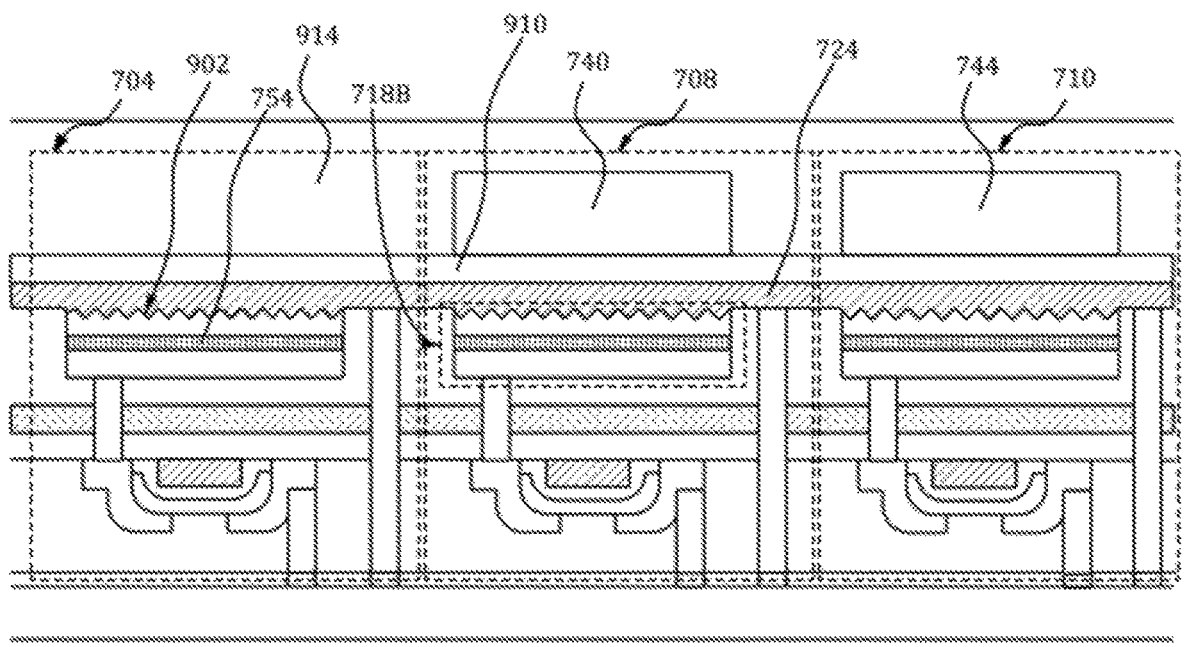

Referring to FIG. 9J, a fourth dielectric layer 910 is deposited on transparent conductive layer 724. Fourth dielectric layer 910 is substantially transparent to light of the wavelength emitted by active layer 754.

Wavelength-converting layer 740 is next deposited on fourth dielectric layer 910. In embodiments where there is no dielectric layer on transparent conductive layer 724, a wavelength-converting layer is deposited directly on transparent conductive layer 724. Wavelength-converting layer 740 will be excited by the light emitted by the active layer 754 and emit light of a different wavelength. In a specific embodiment, wavelength-converting layer 740 may be an organic material, for example silicone, epoxy, or polycarbonate, combined with inorganic phosphor particles such as GaAlN, with the GaAlN phosphor particles excited by light with a dominant wavelength of between 420 and 470 nm (blue) and emitting light with a dominant wavelength of between 500 and 550 nm (red). In a different embodiment, the phosphor particles may be CaAlSiN:Eu, with CaAlSiN:Eu phosphor particles excited by light with a dominant wavelength of between 420 and 470 nm (blue), and emitting light with a dominant wavelength of between 610 and 730 nm (green). Any suitable phosphor particle may be used. In another embodiment, silicone, epoxy, or polycarbonate may be combined with quantum dots, the quantum dots being nano-scale semiconductor material, for example group II-VI material having a composition ZnCdMgSe, CdSe, InP, ZnS, $K_2SiF_6$:Mn, $SrLi_3Al_3N_4$:Eu, or $CsPbBr_3$. In one embodiment, the composition of the quantum dots can be optimized to emit red (500 to 550 nm) or green (610 to 730 nm) light when excited by blue light (420 to 470 nm). Any suitable quantum dot composition may be used. In one embodiment, wavelength-converting layer 740 may be screen printed into any suitable pattern on the wafer.

In a different embodiment, wavelength-converting layer 740 may be phosphor particles or quantum dots embedded in glass, a technique known as phosphor-in-glass (PiG) or quantum dot-in-glass (QDiG). In one embodiment, glass paste combining $SiO_2$, $B_2O_3$, phosphor particles or quantum dots, adhesive, and organic solvent may be screen printed in a pattern on fourth dielectric layer 910 or transparent conductive layer 724 using a stencil. In a different embodiment, the glass paste with phosphor particles or quantum dots may be screen printed without a pattern. The volatile organic components of the glass paste may be removed by drying at 150° C. and sintering at 600° C. In a different embodiment, the PiG or QDiG layer may be deposited by a spin-on technique, in which chemicals and phosphor particles or quantum dots are suspended in organic solvents. The solution is spun as a continuous film. The film is dried and annealed, which substantially removes the organic materials, leaving a glass film with phosphor particles or quantum dots. The glass film with phosphor particles or quantum dots is wavelength-converting layer 740. If wavelength-converting layer 740 was deposited as a continuous film, a masking layer (not shown) can be applied, patterned, and wavelength-converting layer 740 etched. Wavelength-converting layer 740 may be etched by any suitable etchant, including but not limited to acids or corrosive gases. The masking layer is removed. Wavelength-converting layer 740 may be realized in its smallest form by the technique of depositing PiG or QDiG in continuous film form, depositing a masking layer and patterning, etching the film, and then removing the masking layer.

A similar process is repeated to form wavelength-converting layer 744. Wavelength-converting layer 744 may convert light emitted by the underlying LED to a different wavelength than that emitted by wavelength-converting layer 740. For example, if wavelength-converting layer 740 is excited by light with a dominant wavelength of between 420 and 470 nm (blue), and emits light with a dominant wavelength of between 610 and 730 nm (green), then wavelength-converting layer 744 may be excited by light with a dominant wavelength of between 420 and 470 nm (blue), and emit light with a dominant wavelength of between 500 to 550 nm (red). In this manner, the three LEDs shown in FIG. 9J emit blue light, but light emitting device 704 will emit blue light, light emitting device 708 will emit green light, and light emitting device 710 will emit red light.

A passivating layer 914 can be deposited over the plurality of wavelength-converting layers 740 and 744. Passivating layer 914 protects the light emitting devices 704, 708, and 710 from moisture intrusion and/or mobile ions which might degrade the device. Passivating layer 914 can be any suitable material which is substantially transparent to light of the wavelength emitted by the active layers of the LEDs and/or the wavelengths emitted by the wavelength-converting layers. In embodiments in which there are no wavelength-converting layers, dielectric layer 910 can act as a passivating layer. If wavelength-converting layers 740 and 744 contain organic materials, which are sensitive to elevated temperature, passivating layer 914 can be an organic material, including but not limited to silicone, epoxy, or polycarbonate. Use of an organic material for passivating layer 914 can avoid high temperature processing that could compromise wavelength-converting layers 740 and 744 if wavelength-converting layers 740 and 744 were organic. If wavelength-converting layers 740 and 744 are PiG or QDiG, both of which are less sensitive to elevated temperature than an organic material such as silicone, epoxy, or polycarbonate, then passivating layer 914 may comprise either an organic layer such as silicone, epoxy, or polycarbonate or an inorganic dielectric material such $SiO_2$, SiN, $Al_2O_3$, or $TiO_2$, most preferably an inorganic dielectric material. The inorganic dielectric material for passivating layer 914 can be deposited by any suitable method, including but not limited to evaporation, sputtering, or CVD, most preferably CVD. If passivating layer 914 is $SiO_2$, the layer may be between 0.02 and 10 microns thick, in this example about 0.5 microns. Fabrication of an assembly of light emitting devices is now substantially complete.

As described, each fabrication step is completed on many devices simultaneously, reducing the cost of each step per device. As shown in FIG. 9J, with the thin film transistors underneath their respective LED, the space between each LED can be minimized, increasing the density of LEDs per area. With the size of each LED and the space between LEDs determined by photolithographic techniques instead of mechanical sawing the area of each LED may be very small.

The description above is a detailed description of one embodiment of an assembly of light emitting devices and method of manufacture. Summarizing, in one embodiment, a method to fabricate an assembly of light emitting devices is described. It comprises the steps of forming a structure, the structure formed by the steps comprising: forming a plurality of LEDs on an LED substrate, forming a reflective layer, forming a plurality of thin film transistors, wherein each thin film transistor at least partially overlies an LED of the plurality, forming a first plurality of interconnects wherein each interconnect extends through the reflective layer, forming a dielectric layer overlying the thin film transistors, forming a second plurality of interconnects extending from the thin film transistors through dielectric layer; flipping the structure comprising the plurality of LEDs, the reflective layer, the first and second pluralities of interconnects, and the dielectric layer so that in the completed assembly, each LED of the plurality of LEDs at least partially overlies a thin film transistor of the plurality of thin film transistors; and bonding the second plurality of interconnects to a backboard. Several other embodiments are described below.

Figure 10:
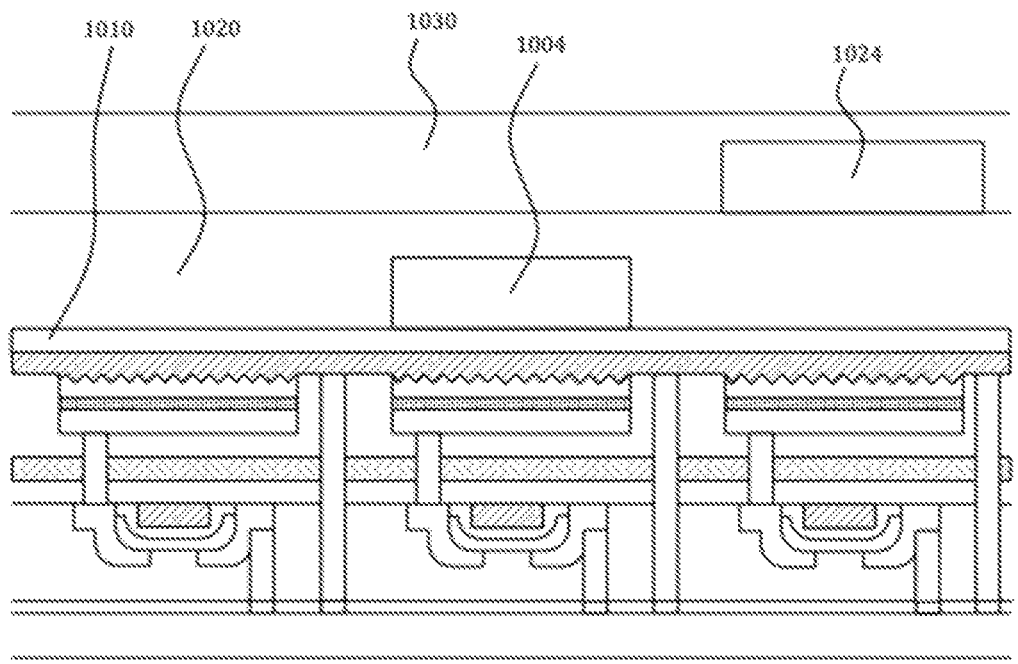
FIG. 10 illustrates a cross sectional view of one embodiment of an assembly of light emitting devices wherein the wavelength-converting layers are disposed on different planes above the LEDs.

FIG. 10 is a schematic cross section of another embodiment of an assembly of light emitting devices. In this embodiment, wavelength-converting layer 1004 is fabricated on fourth dielectric layer 1010. A fifth dielectric layer 1020 is deposited on top of wavelength-converting layer 1004. Wavelength-converting layer 1024 is then fabricated on top of fifth dielectric layer 1020, followed by deposition of passivating layer 1030 on top of wavelength-converting layer 1024.

Figure 11A:
FIG. 11A illustrates a cross sectional view of one embodiment of an assembly of light emitting devices with side reflectors disposed between adjacent LEDs of adjacent light emitting devices.
Figure 11A:
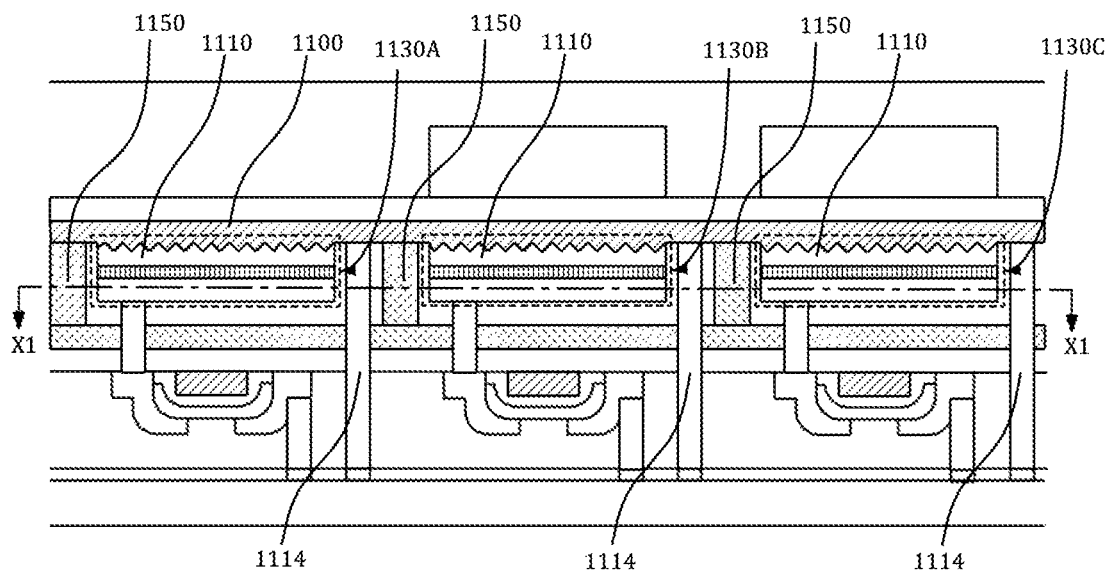

FIG. 11A is a cross sectional schematic of another embodiment of an assembly of light emitting devices. In this embodiment, a transparent conductive layer 1100 electrically connects one of the conductive layers 1110 of each LED 1130. Side reflectors 1150 are disposed around the edges of the LEDs. Side reflectors 1150 prevent light from adjacent LEDs in the plurality of LEDs from interfering with one another. The side reflectors 1150 also help to directionalize the light, in the direction shown by the arrow in FIG. 11A. Side reflectors 1150 may be any suitable material that substantially reflects light of the wavelength emitted by the LED. Side reflectors 1150 may be any suitable material, including but not limited to metals such aluminum, silver, or gold, alloys of aluminum, silver, or gold, or a composite material such as a polymer mixed with metal oxide particles, or a DBR. The metal oxide particles may be, for example, titanium oxide. Side reflectors 1150 may be deposited by any suitable technique, such as sputtering, evaporation, electrodeposition, chemical vapor deposition, liquid dispense, or screen printing.

Figure 11B:
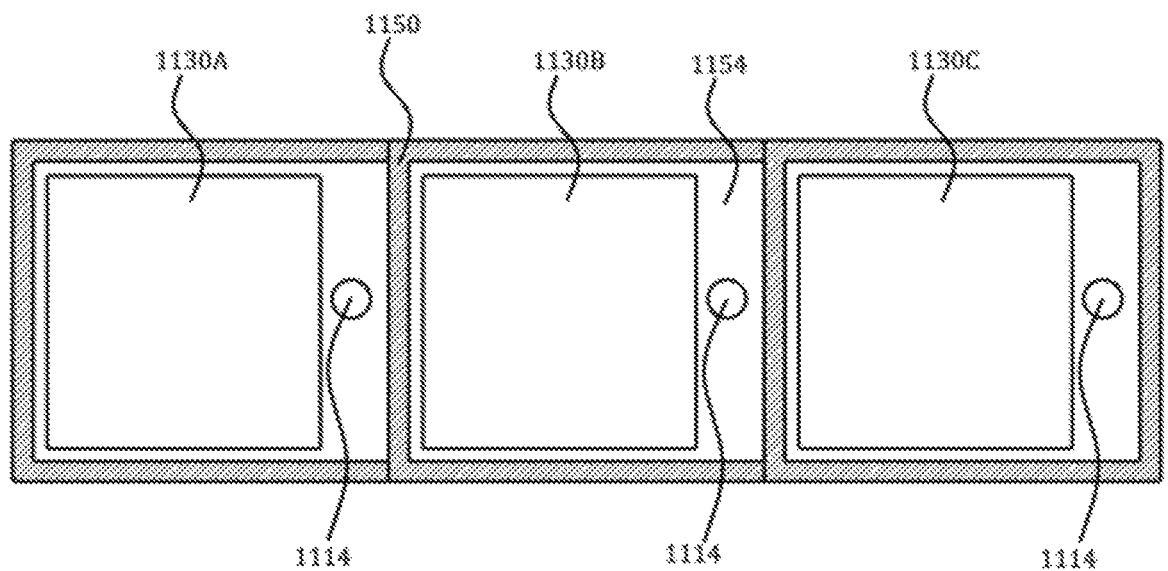
FIG. 11B illustrates a plan view of one embodiment of an assembly of light emitting devices wherein side reflectors surround LEDs of approximately equal area.

FIG. 11B is a plan view of an assembly of light emitting devices shown in FIG. 11A through plane X1-X1. In one example, if side reflectors 1150 are conductive, some portion of dielectric layer 1154 will be disposed between the side reflector 1150 and LED 1130 to electrically isolate side reflectors 1150 from LEDs 1130. Vertical interconnects 1114 connect to their respective LEDs.

Figure 11C:
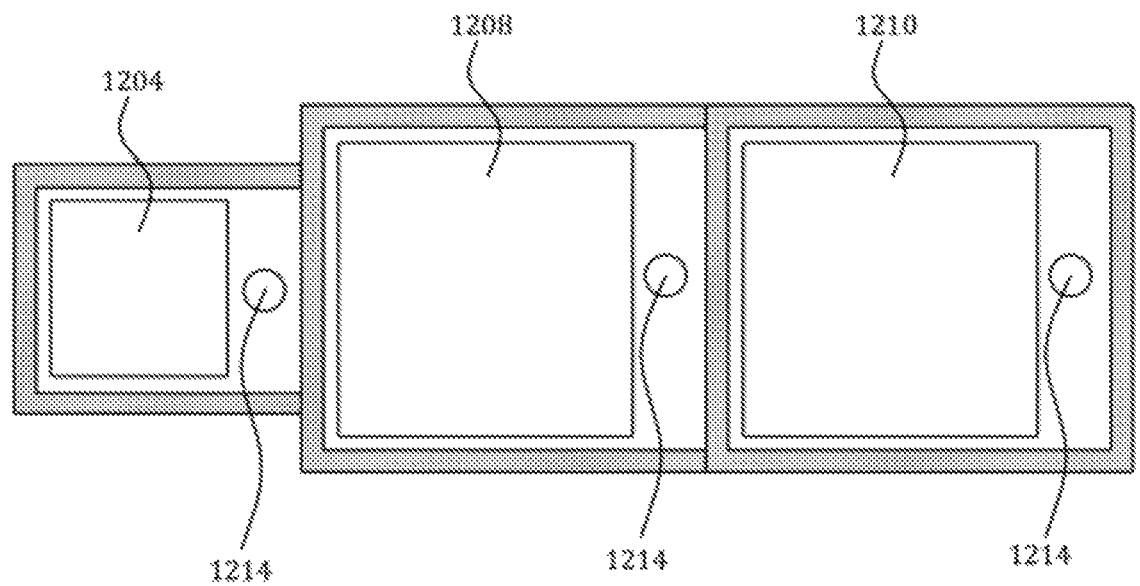
FIG. 11C illustrates a plan view of one embodiment of an assembly of light emitting devices wherein side reflectors surround LEDs of unequal area.

FIG. 11C shows a plan view schematic of a different embodiment of an assembly of light emitting devices, wherein the LEDs do not have the same area. In this embodiment, LED 1204 has a smaller area than LEDs 1208 and 1210. Vertical interconnects 1214 connect to their respective LEDs. The LEDs in an assembly may be any suitable shape or size, and the shape and sizes of individual LEDs in one assembly may differ from one another. The LEDs may have different areas to account for the varying brightness of the light after it has passed through a wavelength-converting layers. By fabricating the LEDs with different areas, the current required to produce a brightness of one color in one light emitting device may be more closely matched to produce a brightness of light with a different color from a different light emitting device.

Figure 12:
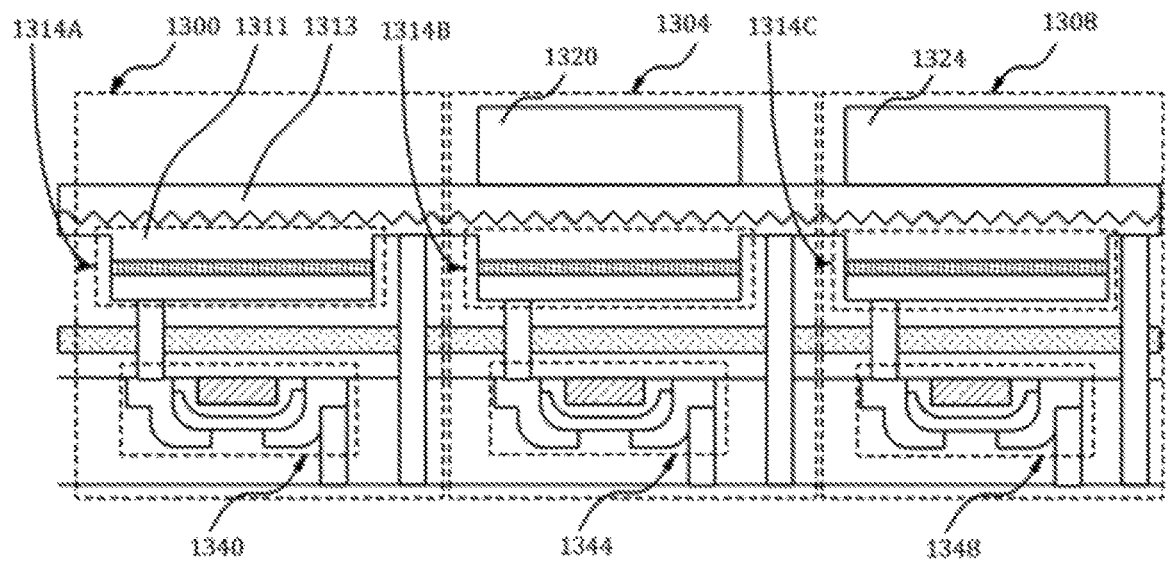
FIG. 12 illustrates a cross sectional view of an embodiment of an assembly of light emitting devices wherein the thin film transistors have been formed by a "gate first" method and wavelength-converting layers exist on one plane above the LEDs.

FIG. 12 shows a cross sectional schematic of another embodiment of an assembly of light emitting devices 1300, 1304, and 1308. In this embodiment, thin film transistors 1340, 1344, and 1348 are fabricated by a "gate first" method, and LEDs 1314 are electrically connected by conductive layer 1311. Wavelength-converting layers 1320 and 1324 are deposited on the same dielectric layer 1313.

Figure 13:
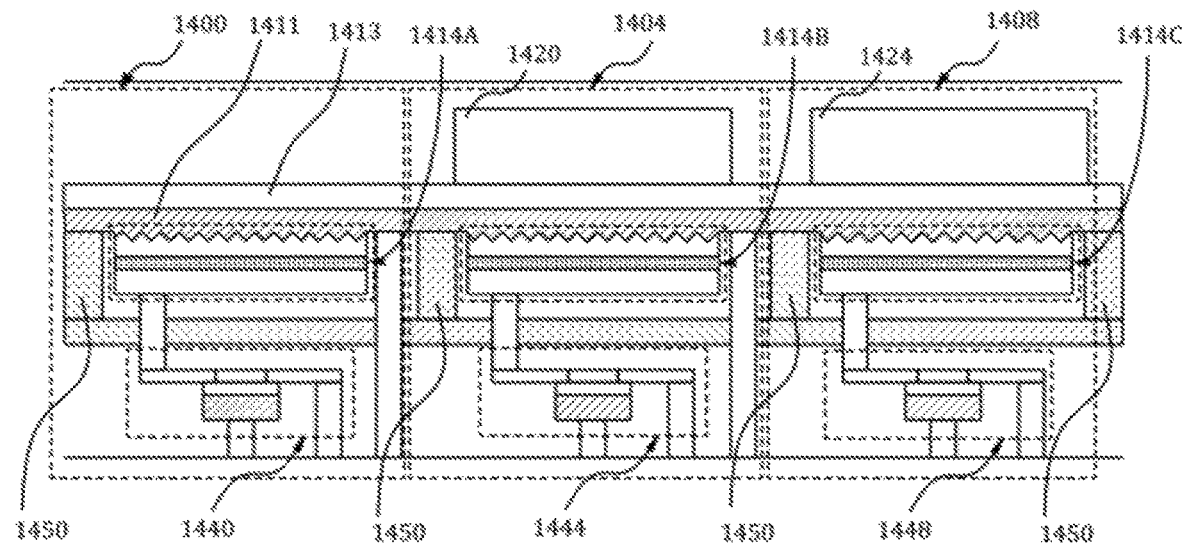
FIG. 13 illustrates a cross sectional view of one embodiment of an assembly of light emitting devices wherein the thin film transistors have been formed by a "gate last" method, side reflectors are disposed between adjacent LEDs of adjacent light emitting devices, a transparent conductive layer is connected to one of each of the conductive layers of the LEDs, and wavelength-converting layers are disposed on one plane above the LEDs.

FIG. 13 shows a cross sectional schematic of another embodiment of an assembly of light emitting devices 1400, 1404, and 1408. The thin film transistors 1440, 1444, and 1448 are fabricated by a "gate last" process, a transparent conductive film 1411 electrically connects the LEDs 1414, and the wavelength-converting layers 1420 and 1424 are deposited on dielectric film 1413. Side reflectors 1450 are disposed between adjacent LEDs.

Figure 14:
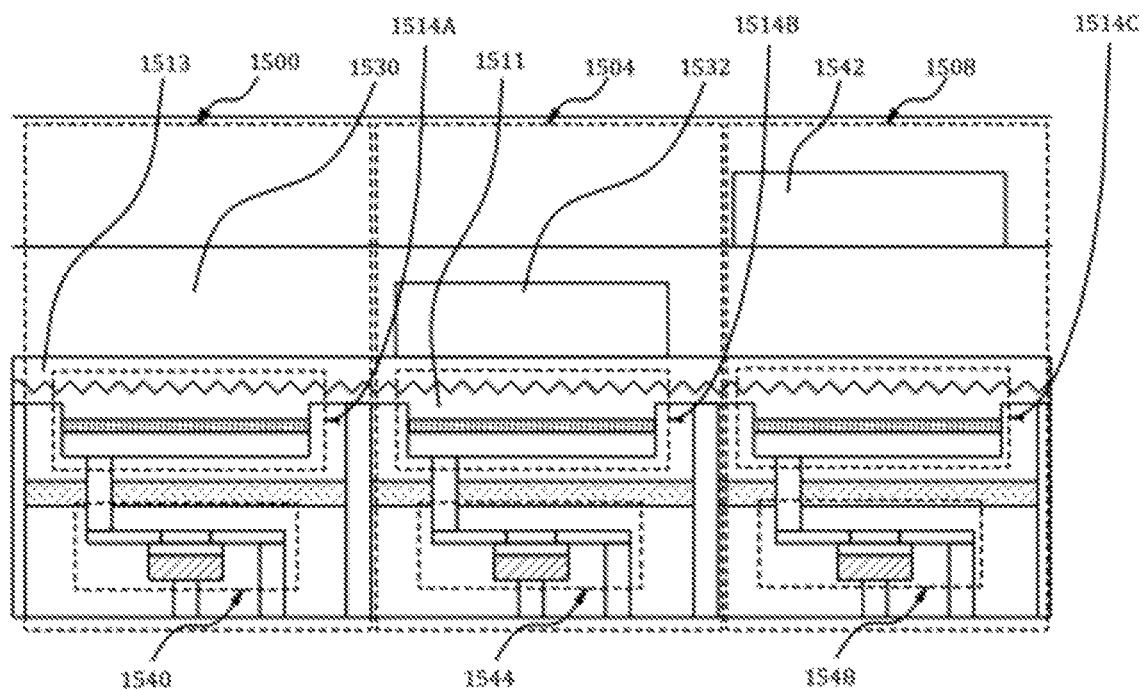
FIG. 14 illustrates a cross sectional view of one embodiment of an assembly of light emitting devices wherein the thin film transistors have been formed by a "gate last" method and wavelength-converting layers are disposed on different planes above the LEDs.

FIG. 14 shows a cross sectional schematic of another embodiment of an assembly of light emitting devices 1500, 1504, and 1508. The thin film transistors 1540, 1544, and 1548 are fabricated by a "gate last" process. Conductive layer 1511 electrically connects LEDs 1514. Wavelength-converting layer 1532 is deposited on dielectric layer 1513 and wavelength-converting layer 1542 is deposited on dielectric layer 1530.

Figure 15:
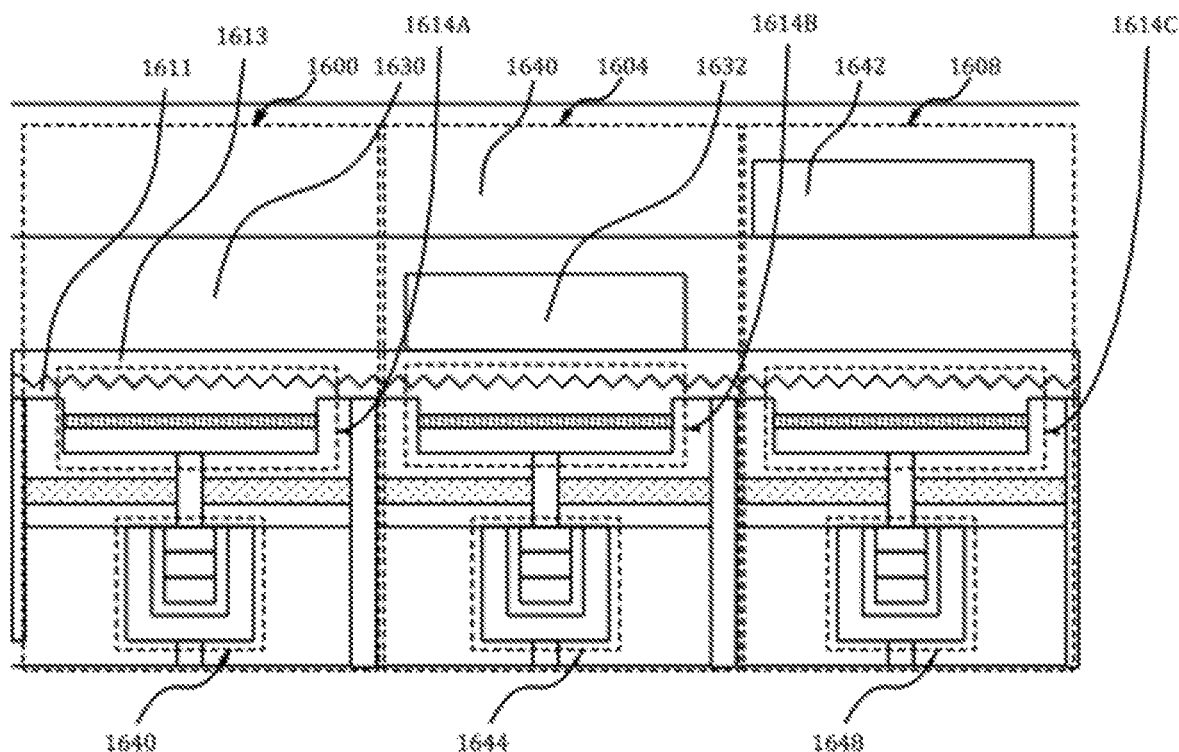
FIG. 15 illustrates a cross sectional view of one embodiment of an assembly of light emitting devices wherein the thin film transistors have vertical channels and wavelength-converting layers are disposed on different planes above the LEDs.

FIG. 15 shows a cross sectional schematic of another embodiment of an assembly of light emitting devices 1600, 1604, and 1608. The thin film transistors 1640, 1644, and 1648 are fabricated by a vertical channel process. Conductive layer 1611 electrically connects LEDs 1614. Wavelength-converting layer 1632 is deposited on dielectric layer 1613 and wavelength-converting layer 1642 is deposited on dielectric layer 1630.

Figure 16:
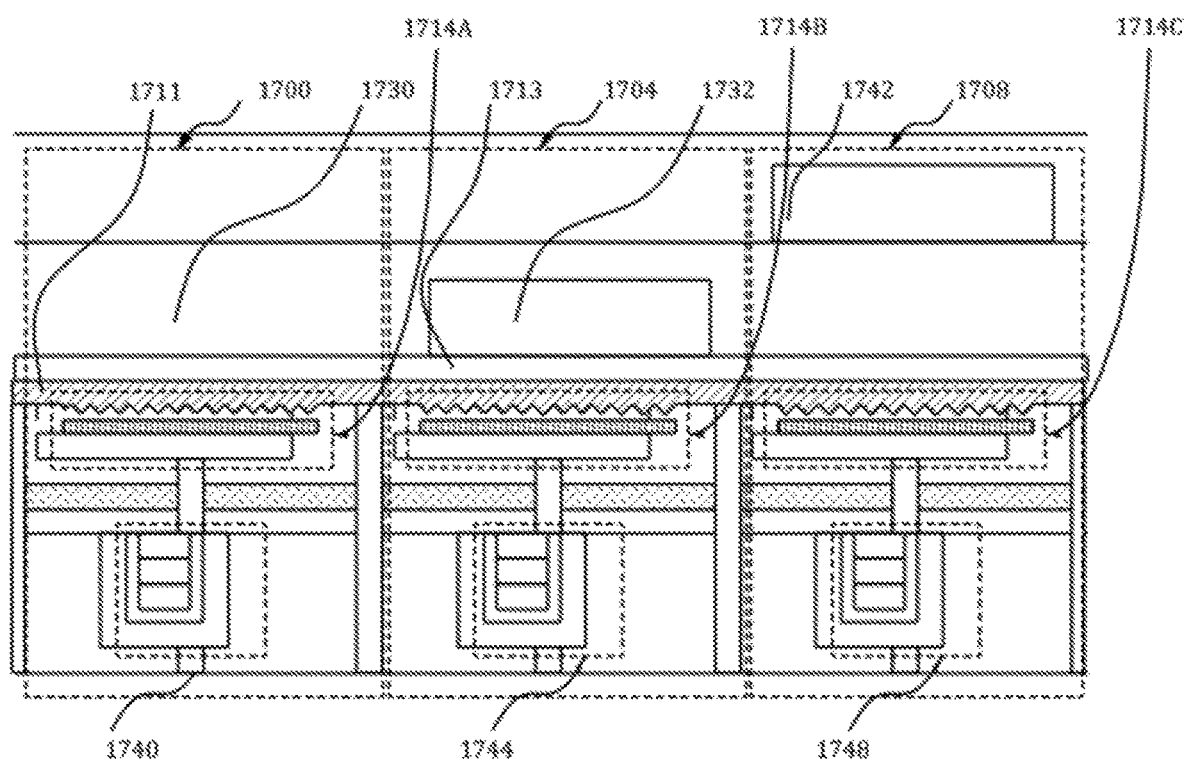
FIG. 16 illustrates a cross sectional view of an embodiment of an assembly of light emitting devices where the thin film transistors have vertical channels, a transparent conducive layer is in contact with the LEDs, and wavelength-converting layers exist on different planes above the LEDs.

FIG. 16 shows a cross sectional schematic of another embodiment of an assembly of light emitting devices 1700, 1704, and 1708. The thin film transistors 1740, 1744, and 1748 are fabricated by with a vertical channel process. Transparent conductive layer 1711 electrically connects LEDs 1714. Wavelength-converting layer 1732 is deposited on dielectric layer 1713 and wavelength-converting layer 1742 is deposited on dielectric layer 1730.

What is claimed is:

1. A method to fabricate a light emitting device comprising the steps of:
    forming a structure, the structure formed by the steps comprising:
        a) forming an LED on an LED substrate, wherein the LED comprises GaP, AlGaAs, GaAsP, AlGaP, GaInP, InGaN, SiC, AlGaN, AlN, InN, or InP;
        b) forming a reflective layer overlying the LED;
        c) forming a thin film transistor overlying the LED, wherein a first interconnect extends through the reflective layer electrically connecting the LED to the thin film transistor;
        d) forming a dielectric layer overlying the thin film transistor; and
        e) forming a second interconnect and a third interconnect extending through the dielectric layer, wherein the second and third interconnects are electrically connected to the thin film transistor;
    flipping the structure comprising the LED, the reflective layer, the thin film transistor, the first, second, and third interconnects, and the dielectric layer, so that, in the completed device, the LED at least partially overlies the thin film transistor, and the reflective layer is disposed between the thin film transistor and the LED; and
    removing the LED substrate after the bonding step.

2. The method of claim 1, further comprising the step of bonding the first interconnect and second interconnect to a backboard.

3. The method of claim 2, wherein the backboard comprises a printed circuit board or an interposer.

4. The method of claim 1, further comprising forming a transparent conductive layer in electrical contact with the LED.

5. The method of claim 4, wherein the transparent conductive layer comprises indium tin oxide, fluorine tin oxide, aluminum zinc oxide, metallic nanoparticles, carbon nanotubes, graphene, or conductive polymers.

6. The method of claim 1, wherein the reflective layer comprises a Bragg reflector.

7. A method to fabricate an assembly of light emitting devices comprising the steps of:
    forming a structure, the structure formed by the steps comprising:

a) forming a plurality of LEDs on an LED substrate, wherein the plurality of LEDs comprises GaP, AlGaAs, GaAsP, AlGaP, GaInP, InGaN, SiC, AlGaN, AlN, InN, or InP;
b) forming a reflective layer;
c) forming a plurality of thin film transistors, wherein each thin film transistor of the plurality of thin film transistors at least partially overlies an LED of the plurality of LEDs;
d) forming a first plurality of interconnects, wherein each interconnect of the plurality extends through the reflective layer;
e) forming a dielectric layer overlying the thin film transistors;
f) forming a second plurality of interconnects extending from the thin film transistors through the dielectric layer;
flipping the structure comprising the plurality of LEDs, the reflective layer, the plurality of thin film transistors, the first and second pluralities of interconnects, and the dielectric layer, so that, in the completed assembly, each LED of the plurality of LEDs at least partially overlies a thin film transistor of the plurality of thin film transistors;

bonding the second plurality of interconnects to a backboard; and
removing the LED substrate after the bonding step.

8. The method of claim 7, further comprising forming a transparent conductive layer on the plurality of LEDs after removing the LED substrate.

9. The method of claim 8, wherein the transparent conductive layer comprises indium tin oxide, fluorine tin oxide, aluminum zinc oxide, metallic nanoparticles, carbon nanotubes, graphene, or conductive polymers.

10. The method of claim 7, further comprising forming at least first and second pluralities of wavelength-converting layers, wherein each wavelength-converting layer overlies an LED of the plurality of LEDs.

11. The method of claim 7, further comprising forming a plurality of side reflectors, wherein each side reflector is disposed between adjacent LEDs and the side reflectors prevents light from adjacent LEDs from interfering with one another.

12. The method of claim 7, wherein the reflective layer comprises a Bragg reflector.

13. The method of claim 7, wherein the backboard comprises a printed circuit board or an interposer.

* * * * *